(12) United States Patent
Ito

(10) Patent No.: US 7,266,799 B2
(45) Date of Patent: Sep. 4, 2007

(54) STEINER TREE HANDLING DEVICE, STEINER TREE HANDLING METHOD, AND STEINER TREE HANDLING PROGRAM

(75) Inventor: Noriyuki Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 420 days.

(21) Appl. No.: 10/893,935

(22) Filed: Jul. 20, 2004

(65) Prior Publication Data

US 2005/0229137 A1     Oct. 13, 2005

(30) Foreign Application Priority Data

Mar. 24, 2004   (JP)   ............................. 2004-087754

(51) Int. Cl.
    *G06F 17/50* (2006.01)
(52) U.S. Cl. .......................... 716/12; 716/13
(58) Field of Classification Search ............. 716/12–14
    See application file for complete search history.

(56) References Cited

FOREIGN PATENT DOCUMENTS

JP    2003-357744    12/2000

OTHER PUBLICATIONS

Bozorgzadeh et al.; Creating and Exploiting Flexibility in Rectilinear Steiner Trees; May 2003; IEEE Transactions on Computer Aided Design of Integrated Circuits and Systems, vol. 22, No. 5; pp. 605-615.*

J. Hu, S. Sapatnekar, "A Timing-constrained Algorithm for Simultaneous Global Routing of Multiple Nets", Proc. ICCAD, 2000.
E. Bozorgzadeh, Ryan, Kastner, Majid Sarrafzadeh, "Creating and Exploiting flexibility in Steiner Trees", Proc. DAC, 2001.
C.J, Albert, G. Gandham, et al., "Steiner Tree Optimization for Buffers, Blockages, and Bays", IEEE TCAD vol. 20, No. 4, 2001.
M. Wang and M. Sarrafzadeh, "Behavior of Congestion Minimization During Placement", Proc. ISPD, 1999.
C.E. Chang, "RISA: Accurate and Efficient Placement Routability Modeling", Proc. ICCAD, 1994.
X. Yang, R. Kastner, and M. Sarrafzadeh, "Congestion Estimation During Top-down Placement", IEEE Transactions on Computer-Aided Design, vol. 21, No. 1, 2002.
W. Hou, H. Yu, and w.H. Kao, "A New Congestion-Driven Placement Algorithm Based on Cell Inflation", Proc. ASPDAC, 2001.
J. Lou, S. Thakur, et al., "Estimating Routing congestion Using Probabilistic Analysis", IEEE Transactions on Computer-Aided Design, vol. 21, No. 1, 2002.
P.N. Parakh, R.B. Brown, and K.A. Sakallah, "Congestion Driven Quadratic Placement", Proc. DAC, 1998.
M. Wang and M. Sarrafzadeh, "Modeling and Minimization of Routing Congestion", Proc. ASPDAC, 2000.

* cited by examiner

*Primary Examiner*—Paul Dinh
*Assistant Examiner*—Suresh Memula
(74) *Attorney, Agent, or Firm*—Staas & Halsey LLP

(57) ABSTRACT

A Steiner tree handling device handles a Steiner tree constituted by plural horizontal or vertical edges connecting plural nodes. The device has a Steiner tree obtaining unit which obtains a Steiner tree having one shape, and a Steiner tree deformation unit which deforms the obtained Steiner tree into a Steiner tree having a different shape, without changing the size of the obtained Steiner tree.

23 Claims, 17 Drawing Sheets

Parallel slide

Flip slide

FIG. 9

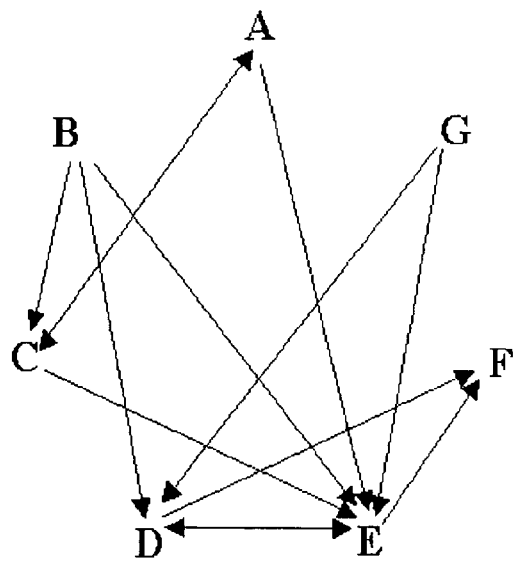

FIG. 10

```
input grid_graph,steiner
output congestion
Check_slidability(grid_graph,steiner,congestion) {
   dependency = NULL
   Check_flip_slide(steiner,dependency)
   for each edge in steiner {
      Check_para_slide(steiner,edge,"FORWARD",dependency)
      Check_para_slide(steiner,edge,"BACKWARD",dependency)
   }
   Get_independent_complete_graphs(steiner,dependency,indepemdency)
   Calculate_congestion(grid_graph,steiner,independency,congestion)
}
```

FIG. 11

```
input steiner,edge,dir
output dependency
Check_para_slide(steiner,edge,dir,dependency) {
   while true {
      Get_destination(steiner,edge,dir,destination)
      Move_edges_to_both_sides(steiner,edge,destination,dependency,result)
      if ( result == "SUCCESSFUL" ) {
         Parallel_slide(steiner,edge,destination,dependency)
         Check_flip_slide(steiner,dependency)
         edge = destination
      } else return
   }
}
```

FIG. 19A
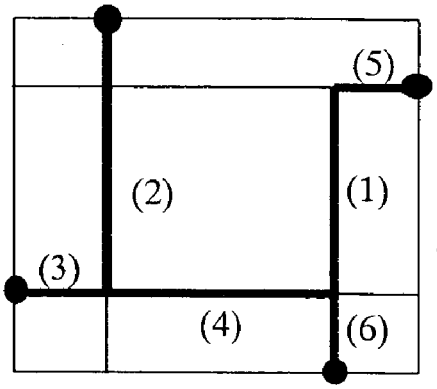
(Deletion)
FIG. 19B
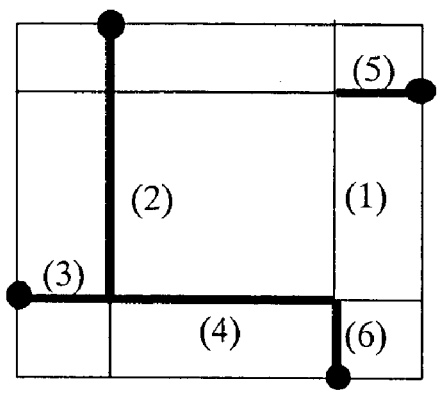
(Reconnection)
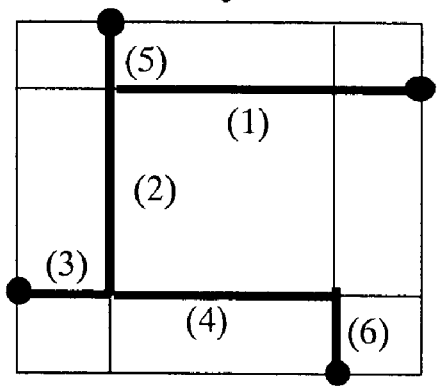
FIG. 19C

STEINER TREE HANDLING DEVICE, STEINER TREE HANDLING METHOD, AND STEINER TREE HANDLING PROGRAM

BACKGROUND OF THE INVENTION

1. Field of the Invention

The present invention relates to a Steiner tree handling device, Steiner tree handling method, and Steiner tree handling program which are capable of providing algorithm for executing deformation of a given Steiner tree, determining a range where the Steiner tree can exist, and obtaining the number of variations on the Steiner tree based on the deformation.

2. Description of the Related Art

Conventionally, the Steiner tree has been widely used to solve problems in wirings in layout designs of LSI. Those designs are represented by prediction of the wiring length or wiring route of a network, route determination in a global wiring, and the like. In the creation algorithm of the Steiner tree, one Steiner tree is created with its edges weighted and with its total cost minimized. Actually, however, there are plural Steiner trees each of which has the minimum cost. This feature is called flexibility. A method focused on a flip of the Steiner tree has been proposed as a method of obtaining a Steiner tree which fits the purpose of design among the plural Steiner trees existing with the minimum cost (for example, see Non-Patent literatures 1 and 2).

The flip means a case that there is no Steiner point on edges between two points that do not exist on the same horizontal or vertical line and connection to either upper-L or lower-L is possible. According to the method of Hu described in the non-patent literature 1, an edge which can be flipped is defined as a soft edge, and fixture of the edge is extended later.

According to the method of Bozorgzadeh et al. described in the non-patent literature 2, deformation is executed on a given Steiner tree to maximize the part which can be flipped. Thus, the flexibility of the flip of the Steiner tree is used to obtain a Steiner tree which fits the purpose of design, so that this method is very effective.

The deformation of the Steiner tree without using a flip, as described above, has been applied to insertion of a repeater avoiding a blockage (for example, see non-patent literature 3). In the method of this Alpert, the path of the Steiner tree is deleted with respect to the Steiner tree created regardless of a blockage, and a route is newly searched for in a maze routing method, to achieve deformation. In this case, the Steiner tree to be given first is a guide. Based on this guide, the Steiner tree is deformed to comply with the purpose of the insertion of a repeater.

Thus, the flexibility of the Steiner tree is a widely applicable property. Conventionally, the number of variations on the Steiner tree is obtained by deformation using the flexibility of the Steiner tree, and estimation of the wire property (e.g., estimation of wire congestion degree) has been achieved. This wire property estimation means that, before actually providing wires, a wiring area is divided into small areas. With respect to each small area, the congestion degree comparing an actual wiring quantity with a wiring-tolerance capacitance indicative of tolerable wiring is calculated to show wiring possibility.

The importance of the wire property estimation lies in that estimation is carried out in the stage of arranging elements and an index for improving the layout is provided to enable wirings. If it is determined that wiring is possible according to a wire property estimation, it is necessary to guarantee that wiring is possible up to details of wires.

Three typical methods of wire property estimation (e.g., wire congestion degree estimation) are known, that is, an experimental method, a probabilistic method, and a global wiring method.

Known experimental method (see non-patent literatures 4 and 5) is a method based on a bounding box. Also known is a method using the Rent's rule (see non-patent literature 6).

Known probabilistic methods are those of Hou and Lou (see non-patent literatures 7 and 8).

Known global wiring methods are those of Parakh et al. and Wang et al. (see non-patent literatures 9 and 10).

Non-Patent Literature 1:
J. Hu, S. Sapatnekar, "A Timing-constrained Algorithm for Simultaneous Global Routing of Multiple Nets", Proc. ICCAD, 2000

Non-Patent Literature 2:
E. Bozorgzadeh, Ryan Kastner, Majid Sarrafzadeh, "Creating and Exploiting Flexibility in Steiner Trees", Proc. DAC, 2001

Non-Patent Literature 3:
C. J. Alpert, G. Gandham, et al, "Steiner Tree Optimization for Buffers, Blockages, and Bays", IEEE TCAD vol. 20, No. 4, 2001

Non-Patent Literature 4:
M. Wang and M. Sarrafzadeh, "Behavior of Congestion Minimization During Placement", Proc. ISPD, 1999

Non-Patent Literature 5:
C. E. Cheng, "RISA: Accurate and Efficient Placement Routability Modeling", Proc. ICCAD, 1994

Non-Patent Literature 6:
X. Yang, R. Kastner, and M. Sarrafzadeh, "Congestion Estimation During Top-down Placement", IEEE Transactions on Computer-Aided Design, Vol. 21, No. 1, 2002

Non-Patent Literature 7:
W. Hou, H. Yu and W. H. Kao, "A New Congestion-Driven Placement Algorithm Based on Cell Inflation", Proc. ASPDAC, 2001

Non-Patent Literature 8:
J. Lou, S. Thakur, et al., "Estimating Routing Congestion Using Probabilistic Analysis", IEEE Transactions on Computer-Aided Design, Vol. 21, No. 1, 2002

Non-Patent Literature 9:
P. N. Parakh, R. B. Brown and K. A. Sakallah, "Congestion Driven Quadratic Placement", Proc. DAC, 1998

Non-Patent Literature 10:
M. Wang and M. Sarrafzadeh, "Modeling and Minimization of Routing Congestion", Proc. ASPDAC, 2000

However, with respect to the methods suggested in the above non-patent literatures 1 to 3, it has been demanded that the range where a Steiner tree exists and the variations on the Steiner tree due to deformation of the Steiner tree are obtained by more effectively using the flexibility of the Steiner tree to achieve more realistic deformation.

In addition, the methods for wire congestion estimation suggested in the above non-patent literatures 4 to 10 involve the following problems:

In the method according to the non-patent literature 4, which uses a bounding box, the simplest model is a method of assuming the half of the peripheral length of the bounding box to be the wiring route, but this model is not practical.

In the method of RISA introduced in the non-patent literature 5, the probability at which a wiring passes a location in a bounding box is obtained based on a wire distribution map created from plural Steiner trees. In this method, the area where wires pass is set within the range of the bounding box, with respect to one net. Further, the possibility that a wire passes a location (x, y) in the range is obtained as a wire distribution map, by changing the number of pins and generating Steiner trees with respect to a plurality of sets obtained with the plural pins located at random for every pin number. The method according to the non-patent literature 6 utilizes a point that the wiring length can be estimated from the Rent's rule.

In these experimental methods, wires are assumed, to some extent, to be provided on even routes where wires do not actually pass. The wire congestion degree estimation does not achieve high precision.

In the method of Hou suggested in the non-patent literature 7 as a probabilistic method, the probability is based on the following prerequisites. That is, a star-model in which each pin is connected from the center of a pin location on a net is used, and either Lower-L or upper-L is used between two pins in actual wiring. In the method of Lou suggested in the non-patent literature 8, a pair of two pins is created based on creation of a Steiner tree, and probabilistic estimation is obtained from all the numbers of routes between the paired two pins.

In these probabilistic methods, the congestion degree between two pins can be calculated including plural bent portions. However, there is a problem that estimation depends on a created Steiner tree because the star and Steiner tree which decide the shape of the net are each one single form.

In estimation of the wire congestion degree according to the methods of Parakh et al. suggested in the non-patent literature 9 and of Wang et al. suggested in the non-patent literature 10 as methods based on global wiring, the precision is high when using the same global wiring as that used in estimation of actual wiring. In these methods, however, the estimation generally tends to depend on the capability of the global wiring engine. There is also a problem that the estimation results differ depending on the capability of global wires used.

The present invention has been made in view of the problems described above and its object is to provide a handling device for a Steiner tree, a handling method thereof, and a handling program thereof, which can deform a Steiner tree with use of flexibility of the Steiner tree, can hence obtain a range where the Steiner tree can exist or obtain the number of variations on the Steiner tree, and can further estimate the wire congestion degree with high precision by using the results obtained.

SUMMARY OF THE INVENTION

To solve the above problems, according to an aspect of the present invention, a Steiner tree handling device which handles a Steiner tree constituted by plural horizontal or vertical edges connecting plural nodes, comprises: a Steiner tree obtaining unit which obtains a Steiner tree having at least one shape; and a Steiner tree deformation unit which deforms the obtained Steiner tree into a Steiner tree having a different shape without changing its size.

In the Steiner tree handling device according to the present invention, the Steiner tree deformation unit may deform the Steiner tree, maintaining continuity of the Steiner tree.

Also in the Steiner tree handling device according to the present invention, the Steiner tree deformation unit may deform the Steiner tree by deleting an edge of the Steiner tree to create two edge sequences and reconnecting the sequences with use of an edge different from the deleted edge.

The Steiner tree handling device according to the present invention may further comprise a slidability determination unit which determines whether one edge is slidable or not based on a predetermined determination reference, wherein the Steiner tree deformation unit slides the one edge to deform the Steiner tree.

In the Steiner tree handling device according to the present invention, if an edge of the Steiner tree exists on opposed edges of a Bin formed by the Steiner tree and if an end of another edge or a node exists on each of two ends of each of the opposed edges, the slidability determination unit may determine that the edge of the Steiner tree on the opposed edges is parallel-slidable.

Also in the Steiner tree handling device according to the present invention, if an edge of the Steiner tree exists on two adjacent edges of four edges of a rectangle surrounding a Bin formed by the Steiner tree and if no node of the Steiner tree exists on an intersection of the two adjacent edges, the slidability determination unit may determine that the edge on the two adjacent edges is flip-slidable.

Also in the Steiner tree handling device according to the present invention, the slidability determination unit may use, as a deformation property of the Steiner tree, a rule that in deformation based on a parallel or flip slide or a combination thereof, the number of vertical edges of the Steiner tree in a horizontal row defined by each of plural Bins formed by the Steiner tree is constant and the number of horizontal edges of the Steiner tree in a vertical column defined by each of plural Bins formed by the Steiner tree is constant.

Also in the Steiner tree handling device according to the present invention, the slidability determination unit may use, as a deformation property of the Steiner tree, a rule that an edge is not slidable if any other edge of the Steiner tree cannot be located on both edges of one single Bin which makes the edge slidable, by deformation based on a parallel or flip slide or a combination thereof.

Also in the Steiner tree handling device according to the present invention, the slidability determination unit may use, as a deformation property of the Steiner tree, a rule that the number of vertical edges existing in a horizontal row defined by a Bin is one, all horizontal edges of the Steiner tree cannot intersect the horizontal row by a parallel slide, and if the number of horizontal edges existing in a vertical column defined by a Bin is one, all vertical edges of the Steiner tree cannot intersect the vertical column by a parallel slide.

Also in the Steiner tree handling device according to the present invention, the slidability determination unit may use, as a deformation property of the Steiner tree, a rule that if only one edge is connected to a location which is not a node of the Steiner tree, the edge cannot be parallel-slid.

Also, the Steiner tree handling device according to the present invention may further comprise a dependency graph creation unit which creates a dependency graph by determining dependency as to whether slides of each edge depend on slides of other edges or not, when the Steiner tree deformation unit performs the deformation.

Also, the Steiner tree handling device according to the present invention may further comprise an independent slide group determination unit which determines a group of independently slidable edges, based on the graph created by the dependency graph creation unit.

Also, the Steiner tree handling device according to the present invention may further comprise a total variation number calculation unit which obtains the total number of deformed variations on the Steiner tree, based on a determination result from the independent slide group determination unit.

Also, the Steiner tree handling device according to the present invention may further comprise a partial variation calculation unit which, if an edge of the Steiner tree moves in a predetermined range, calculates the number of those deformed variations on the Steiner tree that includes the edge moving, based on a determination result from the independent slide group determination unit.

Also, in the Steiner tree handling device according to the present invention, the partial variation calculation unit may calculate a wire quantity for every predetermined area, in each of the vertical and horizontal directions, regarding every edge in one shape of the Steiner tree as a wire.

Also, the Steiner tree handling device according to the present invention may further comprise a congestion degree calculation unit which calculates congestion degree of edges in a predetermined area, based on the total number of variations on the Steiner tree calculated by the total variation number calculation unit, and the number of variations on the Steiner tree calculated by the partial variation calculation unit.

Also in the Steiner tree handling device according to the present invention, if the number of those edges that pass any of plural predetermined areas exceeds a predetermined number as the Steiner tree is deformed, edges may be regarded as not being slidable in said any of the predetermined areas, and the Steiner tree may be deformed again, to calculate the total number of variations by the total variation number calculation unit and the number of variations by the partial variation calculation unit.

Also in the Steiner tree handling device according to the present invention, the deformation made again and the calculations may be performed on plural Steiner trees which are obtained by the Steiner tree obtaining unit respectively in correspondence with plural different sets of nodes.

According to another aspect of the present invention, a Steiner tree handling method for handling a Steiner tree constituted by plural horizontal or vertical edges connecting plural nodes comprises: an obtaining step of obtaining a Steiner tree; and a Steiner tree deformation step of deforming the obtained Steiner tree into a Steiner tree having a different shape without changing its size.

Also, the Steiner tree handling method according to the present invention may further comprise a dependency graph creation step of creating a dependency graph by determining dependency as to whether slides of each edge depend on slides of other edges or not, in the Steiner tree deformation step.

Also, the Steiner tree handling method according to the present invention may further comprise an independent slide group determination step of determining a group of independently slidable edges, based on the graph created in the dependency graph creation step.

Also, the Steiner tree handling method according to the present invention may further comprise a total variation number calculation step of obtaining the total number of deformed variations on the Steiner tree, based on a determination result from the independent slide group determination step.

Also, the Steiner tree handling method according to the present invention may further comprise a partial variation calculation step of, if an edge of the Steiner tree moves in a predetermined range, calculating the number of those deformed variations on the Steiner tree that includes the edge moving, based on a determination result from the independent slide group determination step.

Also, the Steiner tree handling method according to the present invention may further comprise a congestion degree calculation step of calculating congestion degree of edges in a predetermined area, based on the total number of variations on the Steiner tree calculated by the total variation number calculation step, and the number of variations on the Steiner tree calculated by the partial variation calculation step.

In the Steiner tree handling method according to the present invention, if the number of those edges that pass any of plural predetermined areas exceeds a predetermined number as the Steiner tree is deformed, edges may be regarded as not being slidable in said any of the predetermined areas, and the Steiner tree deformation step, the total variation number calculation step, and the partial variation calculation step may be repeated again.

According to another aspect of the present invention, a Steiner tree handling program makes a computer execute a processing of handling a Steiner tree constituted by plural horizontal or vertical edges connecting plural nodes, the processing comprising: an obtaining step of obtaining a Steiner tree; and a Steiner tree deformation step of deforming the obtained Steiner tree into a Steiner tree having a different shape without changing its size.

In the Steiner tree handling program according to the present invention, the processing may further comprise a dependency graph creation step of creating a dependency graph by determining dependency as to whether slides of each edge depend on slides of other edges or not, in the Steiner tree deformation step.

Also in the Steiner tree handling program according to the present invention, the processing may further comprise an independent slide group determination step of determining a group of independently slidable edges, based on the graph created in the dependency graph creation step.

Also in the Steiner tree handling program according to the present invention, the processing may further comprise a total variation number calculation step of obtaining the total number of deformed variations on the Steiner tree, based on a determination result from the independent slide group determination step.

Also in the Steiner tree handling program according to the present invention, the processing may further comprise a partial variation calculation step of, if an edge of the Steiner tree moves in a predetermined range, calculating the number of those deformed variations on the Steiner tree that includes the edge moving, based on a determination result from the independent slide group determination step.

Also in the Steiner tree handling program according to the present invention, the processing may further comprise a congestion degree calculation step of calculating congestion degree of edges in a predetermined area, based on the total number of variations on the Steiner tree calculated by the total variation number calculation step, and the number of variations on the Steiner tree calculated by the partial variation calculation step.

Also in the Steiner tree handling program according to the present invention, if the number of those edges that pass any of plural predetermined areas exceeds a predetermined number as the Steiner tree is deformed, edges may be regarded as not being slidable in said any of the predetermined areas, and the Steiner tree deformation step, the total variation number calculation step, and the partial variation calculation step may be repeated again.

Note that the program described above may be stored in a recording medium which is readable from a computer, and the program can be executed by a computer constituting a Steiner tree handling device. Recording media of this kind readable from a computer may include, for example, a portable storage medium such as a CD-ROM, flexible disk, DVD disk, magneto-optical disk, IC card, or the like, a database which stores computer programs, another computer, a database thereof, and further, a transfer medium on a line.

Thus, according to the present invention, advantages are obtained in that a lot of deformed variations on a Steiner tree is obtained, application to wire congestion degree estimation which requires high precision is achieved independently from the types of wiring tools used in wiring processes, and circuit design which satisfies various wire specifications can be achieved with ease.

BRIEF DESCRIPTION OF THE DRAWINGS

FIG. 7A shows a parallel slide and FIG. 7B shows a flip slide;

FIG. 9 shows a dependency graph;

FIG. 10 shows a pseudo code of an algorithm for calculating wire congestion degree by applying sequential deformation with respect to one RST;

FIG. 11 shows a pseudo code of "Check_para_slide";

FIGS. 19A to 19C are graphs complementarily explaining the operation of FIG. 18;

DETAILED DESCRIPTION OF THE INVENTION

Embodiments of the present invention will now be described with reference to the drawings.

<Structure of Entire Device>

Figure 1:
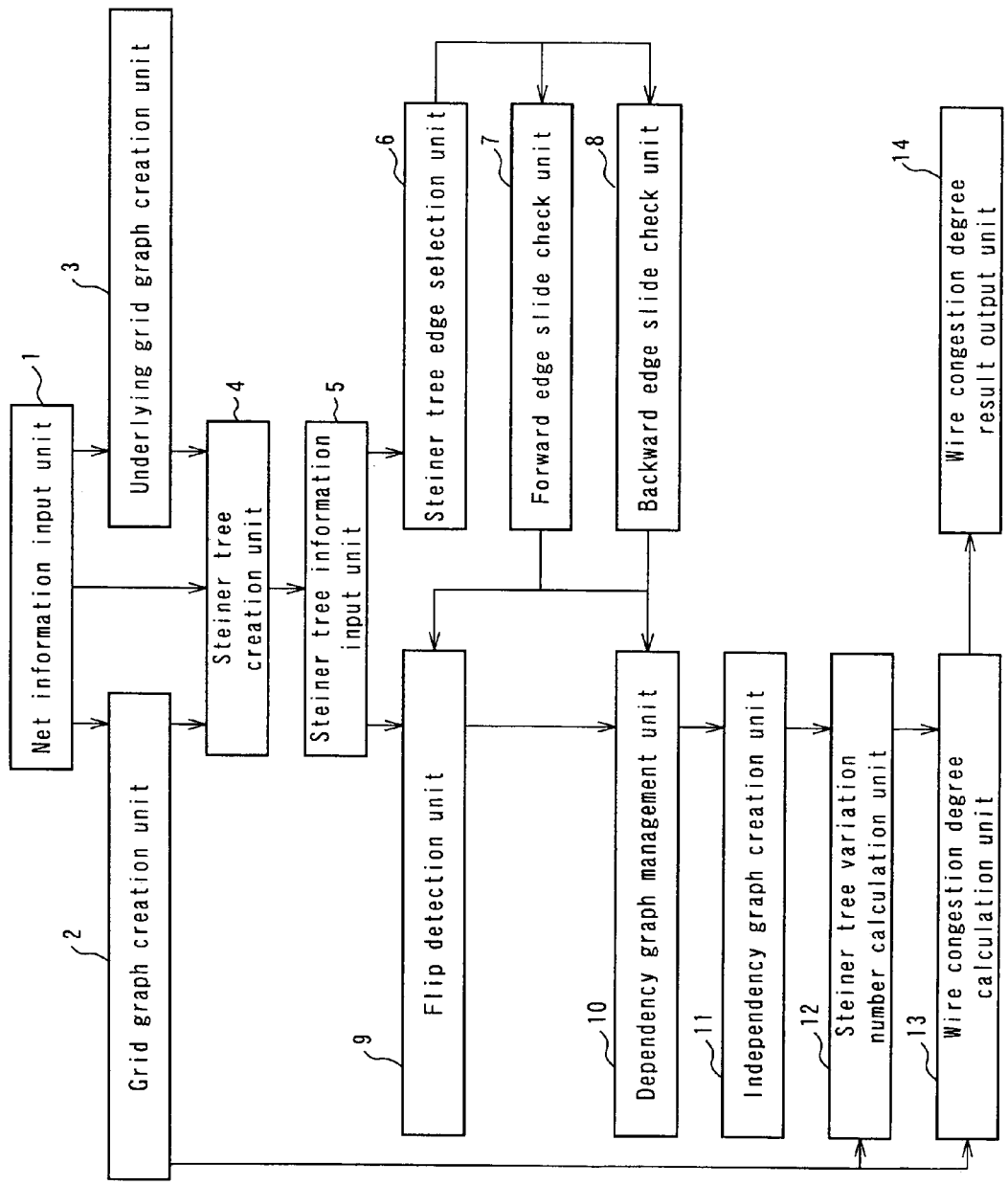
FIG. 1 is a block diagram showing a handling device for a Steiner tree according to an embodiment of the present invention.

FIG. 1 is a block diagram showing a handling device for a Steiner tree, according to an embodiment of the present invention. This device has: a net information input unit 1 for inputting information of a net; a grid graph creation unit 2 which creates a grid graph; an underlying grid graph creation unit 3 which creates an underlying grid graph; a Steiner tree creation unit 4 which creates a Steiner tree; a Steiner tree information input unit 5 for inputting information of a created Steiner tree; a Steiner tree edge selection unit 6 which selects an edge of the inputted Steiner tree; a forward edge slide check unit 7 which determines whether the edge is slidable in the forward direction or not; and a backward edge slide check unit 8 which determines whether the edge is slidable in the backward direction or not.

The Steiner tree handling device also has: a flip detection unit 9 which detects locations where a flip is possible based on information of the created Steiner tree and check results from slide check units 7 and 8; a dependency graph management unit 10 which creates and manages a dependency graph based on the slide check and detected flip; an independency graph creation unit 11 which creates an independency graph (complementary graph) from the dependency graph; a Steiner tree variation number calculation unit 12 which calculates the number of variations on the Steiner tree, based on the independency graph and a grid graph; a wire congestion degree calculation unit (edge congestion degree calculation unit) 13 which calculates the wire congestion degree, based on the results thereof; and a wire congestion degree calculation result output unit 14 which outputs the result thereof.

Note that the Steiner tree variation number calculation unit 12 constitutes a total variation number calculation unit which calculates the total number of variations on the Steiner tree according to the present invention, and a partial variation calculation unit which calculates the number of variations on the Steiner tree when an edge exists in a predetermined area. Also, the net information input unit 1 to the Steiner tree creation unit 4 constitute a Steiner tree obtaining unit of the present invention. Further, the Steiner tree edge selection unit 6 to the flip detection unit 9 constitute a Steiner tree deformation unit of the present invention. Also, the dependency graph management unit 10 constitutes the dependency graph creation unit of the present invention. Further, the independency graph creation unit is constituted by an independency slide group determination unit.

<Creation of Steiner Tree>

Figure 2:
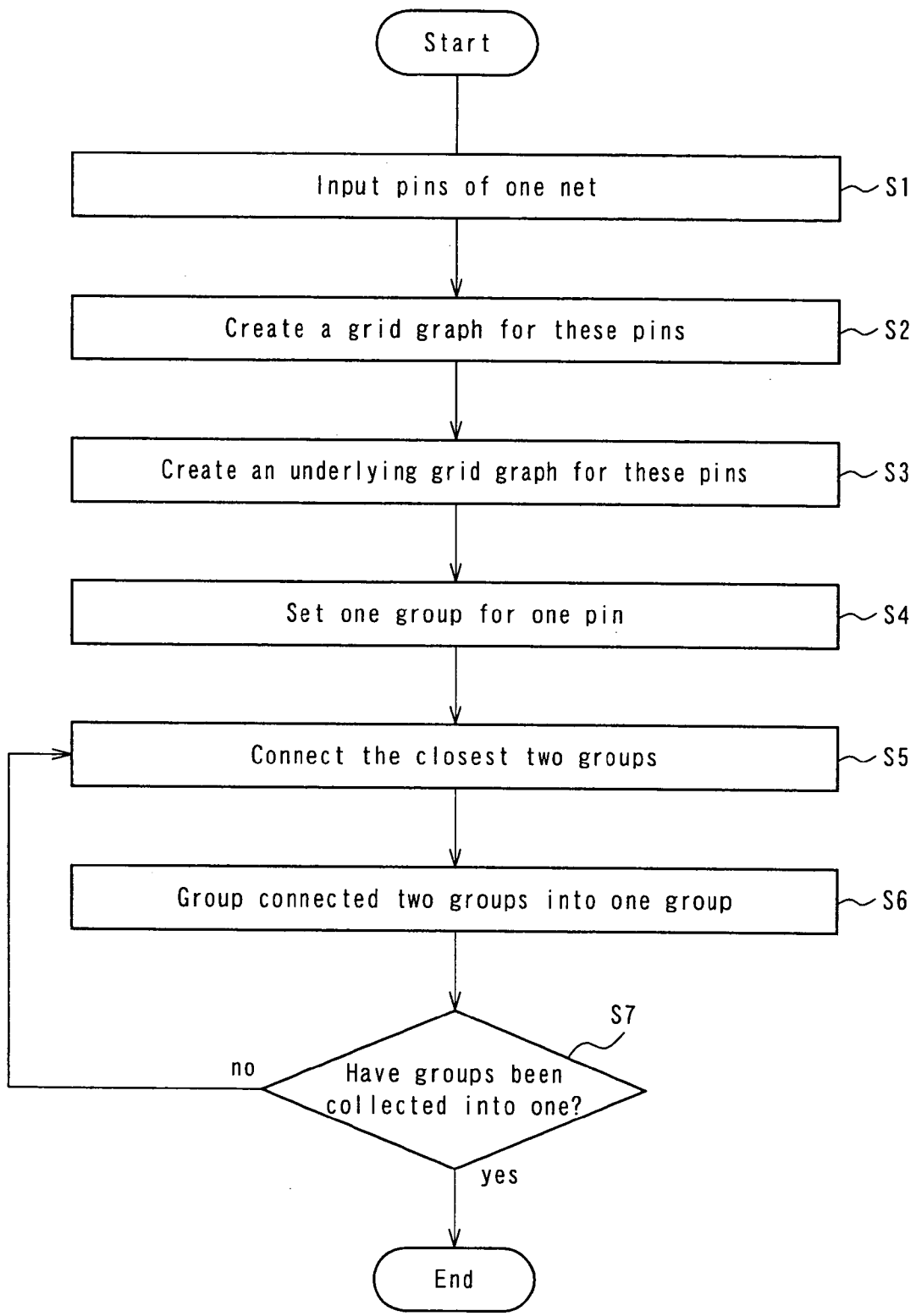
FIG. 2 is a flowchart which explains operation of creating a Steiner tree.
Figure 3:
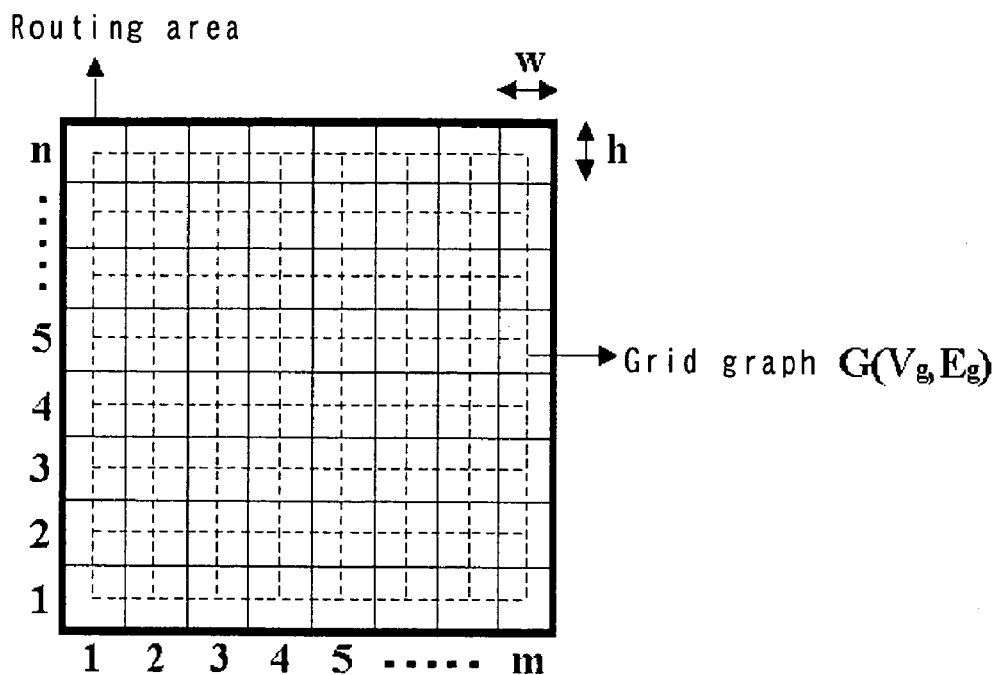
FIG. 3 shows a grid graph.
Figure 4:
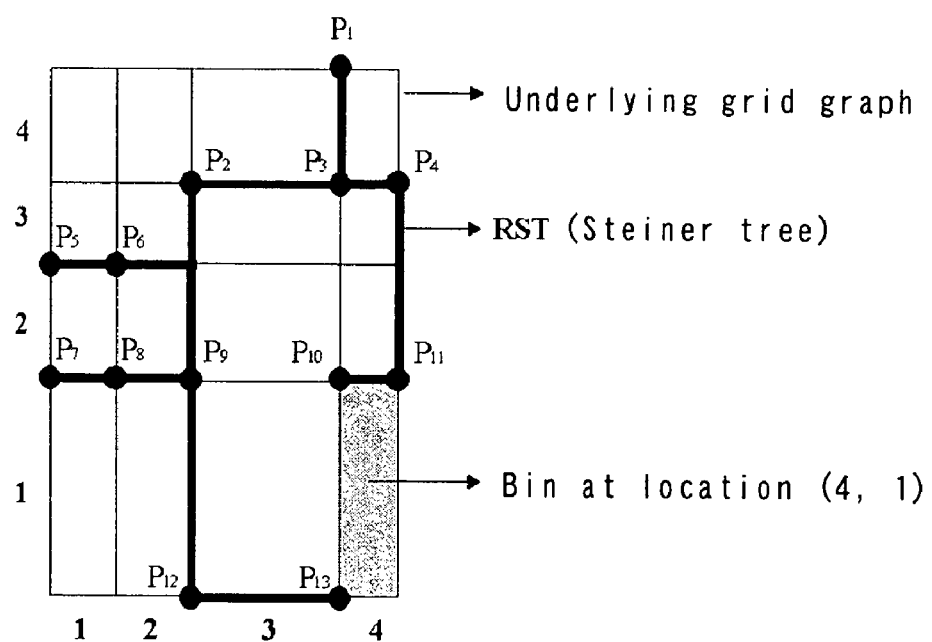
FIG. 4 shows an underlying grid graph.

FIG. 2 is a flowchart which depicts the operation of creating a Steiner tree by means of the grid graph creation unit 2, the underlying grid graph creation unit 3, and the Steiner tree creation unit 4. FIG. 3 shows a grid graph, and FIG. 4 shows an underlying grid graph. FIGS. 5A to 5D are conceptual views showing an operation example of the Steiner tree creation unit 4.

The operation of creating a Steiner tree will now be described.

At first, plural pins are inputted with respect to a net from the net information input unit 1 (step S1). With respect to these pins, the grid graph creation unit 2 creates a grid graph (step S2).

A wiring area of the grid graph is conceptually divided into m×n rectangular areas, as shown in FIG. 3. All the rectangular areas have the same width w and height h. One rectangular area is taken as a vertex, and G(Vg, Eg) is defined such that an edge exists between adjacent vertices.

A circuit to be wired on the wiring area is expressed by a hyper graph H(Pall, Nall). Pall is a set of pins of cells, and each pin is a vertex of the graph. Nail is a set of edges in the graph. Each edge is a partial set of Pall which consists of two or more pins, and expresses a net of the circuit. It is assumed that layout of the cells has already been completed in the circuit to be wired. That is, it is assumed that the vertices on which the pins exist have already determined, in H(Pall, Nall).

Described next will be an underlying grid graph created by the underlying grid graph creation unit 3 (step S3).

With respect to a set of pins P∈Pall forming part of a net N∈Nall, a rectilinear Steiner tree (hereinafter called RST) means the tree that has the smallest total wire length and has vertical or horizontal edges, among trees each of which connects all the pins in the net.

The RST consists of vertices and edges and is defined as S(Vs, Es).

The underlying grid graph is a grid graph consisting of all horizontal and vertical lines which pass all the pins P in the net, as shown in FIG. 4, and defined as U(Vu, Eu).

Figure 5A:
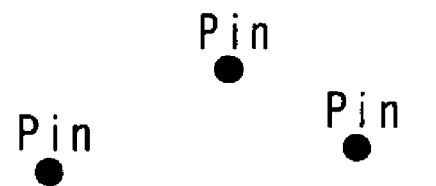
FIGS. 5A to 5D are conceptual views showing an example of operation of a Steiner tree creation unit.
Figure 5B:
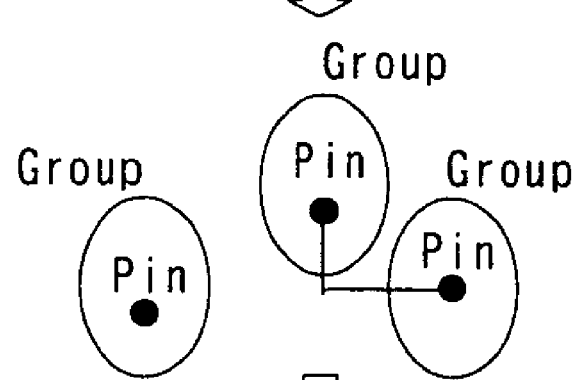
Figure 5C:
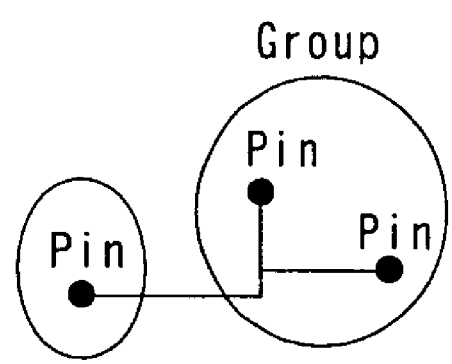
Figure 5D:
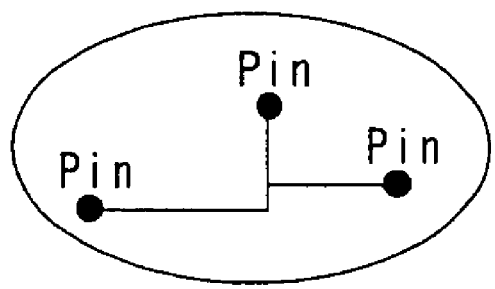

The RST creation unit sets one group for each pin, as shown in FIG. 5B, based on plural pin information items inputted as shown in FIG. 5A (step S4), and also connects the two closest groups (step S5). Further, as shown in FIG. 5C, the connected two groups are grouped into one group (step S6), and this processing is repeated (step S7). Finally, as shown in FIG. 5D, all the groups are grouped into one, thus creating a RST. In U(Vu, Eu) in FIG. 4 showing an example of a created RST, an area (rectangular area) which is surrounded by four edges (grid edges of the graph) and does not include another edge is called Bin.

According to a literature "M. Hanan. On Steiner's problem with rectilinear distance, SIAM J. Appl. Math., 14(1966), pp. 255-265", it is known that the underlying grid graph is called a Hanan grid, and a RST exists at least as a sub-graph of the Hanan grid.

When there is any vertex which is not a pin P and is connected to three or more edges, among vertices of the RST, the vertex is called a Steiner point. In the RST in FIG. 4, the vertex at the South-East corner of Bin (2, 3) is the Steiner point. The size of the RST is the total sum of lengths of the edges constituting the RST and is defined as |S(Vs, Es)|.

According to a literature "J. Ho, G. Vijayan and C. K. Wong, "New Algorithms for the Rectilinear Steiner Tree Problem", IEEE Transactions on Computer-Aided Design, Vol. 9, No. 2, 1990", the RST is called stable if a RST does not overlap any other edge due to a flip.

<Deformation of RST>

(Importance of Deformaiton of RST)

When a RST S(Vs, Es) which connects all pins P included in the multi-pin net N∈Nall is given, the RST is deformed without changing the size |S(Vs, Es)| of the RST while maintaining the condition that the RST belongs to the net N. This deformation is carried out only by sliding and flipping existing edges on G(Vg, Eg). The set of all RSTs created by the deformation of the RST is expressed as T(S(Vs, Es)). On G(Vg, Eg), the vertex at the location (x, y) is expressed as v(x, y), and four edges of a wiring area corresponding to this vertex are respectively expressed as East, West, North, and South.

The set of RSTs which pass any of four edges of the wiring area corresponding to v(x, y), in T(S(Vs, Es)) is defined as Tx, y, dir(S(Vs, Es)). The "dir" is any one of East, West, North, and South. The four edges of each of wiring areas corresponding to vertices of G(Vg, Eg) have respectively predetermined wiring-tolerance capacitances which are defined as C(x, y, dir).

The set of vertices on G(Vg, Eg) which satisfy |Tx, y, dir(S(Vs, Es))|>0 indicates an area through which a given RST can pass due to deformation thereof. Where the set of RSTs whose edge i passes the edge dir at the location (x, y) is defined as Ti, x, y, dir(S(Vs, Es)) with respect to the RST S(Vs, Es) given to one net, the probability "Pi, x, y, dir" at which the edge i passes the edge dir at the location (x, y) is the expression (1). This probability Pi, x, y, dir is called a probabilistic wire request quantity on the edge dir at the location (x, y).

The total sum "Qx, y, dir" of the wire request quantity can be calculated by the expression (2). The addition of the expression (2) is executed with respect to i. The total sum of Qx, y, dir obtained with respect to all nets is divided by the wiring-tolerance capacitance C(x, y, dir), and thus, the wire congestion degree can be obtained on the edge dir at the location (x, y).

Accordingly, where one RST S(Vs, Es) is given, the problem to be solved is to obtain the number |T(S(Vs, Es))| of RSTs available from deformation of the RST and to obtain |Ti, x, y, dir(S(Vs, Es))| for each edge of the RST.

$$Pi, x, y, dir=|Ti, x, y, dir(S(Vs, Es))|/|T(S(Vs, Es))| \quad (1)$$

$$Qx, y, dir=\Sigma pi, x, y, dir \quad (2)$$

(Deformation Algorithm for RST)

When a stable RST S(Vs, Es) is given, a greedy algorithm is proposed to obtain |T(S(Vs, Es))| and |Ti, x, y, dir(S(Vs, Es))|, using an underlying grid graph U(Vu, Eu) for the RST.

In the algorithm, the dependency of edge movability upon the movable range of each edge in U(Vu, Eu) of the RST is obtained. The number of variations on the RST is then obtained from the dependency. Of the number of variations, the number of those variations in which each Bin on U(Vu, Eu) has an edge is obtained for every Bin.

Figure 6A:
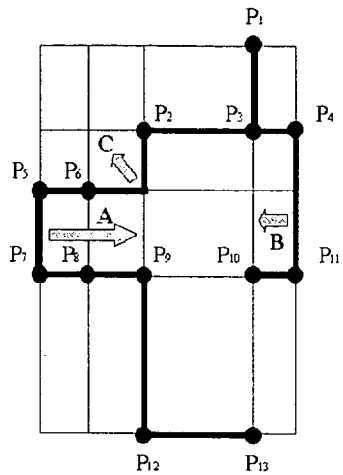
FIGS. 6A and 6B are graphs explaining conditions of movable edges.
Figure 6B:
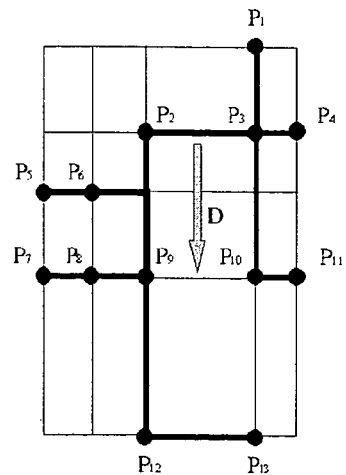

The number of variations on the RST is used to obtain the number |T(S(Vs, Es))| of RSTs depending on deformation. The number of variations which is obtained for every Bin is used to obtain a set of RSTs |Ti, x, y, dir(S(Vs, Es))| in which an edge i passes dir at the location (x, y). In FIGS. 6A and 6B, when a RST is given as shown in FIG. 6A on the left side, edges can move as indicted at A, B, and C. If the edges are moved as indicated at A and C, edges can further move as indicated at D in FIG. 6B. The algorithm in the present embodiment is based on a procedure of counting up the numbers of RSTs created according to movements of edges. A route between two points which are not positioned horizontally or vertically to each other is assumed to be a bent route having an L-shape or Z-shape having two bent corners.

(Basic Deformation)

Figure 7A:
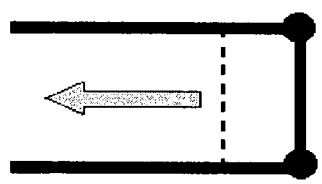
FIGS. 7A and 7B show basic deformation of a Steiner tree where
Figure 7B:
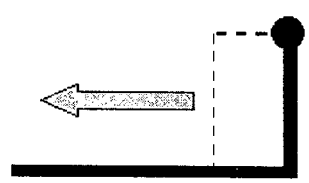

Deformation of a RST is first executed by two operations as shown in FIGS. 7A and 7B, based on arbitrary combination of parallel slides and flip slides. These operations enables deformation without cutting connections of the RST, and hence are called sequential deformation. These operations are all executed on U(Vu, Eu).

(Definition 1: Parallel Slide)

If an edge of a RST exists bridging opposed parallel edges of a Bin on U(Vu, Eu) and if ends or nodes of other edges exist at both ends of each of the opposed parallel edges, the edge bridging the parallel edges can be slid parallel.

(Definition 2: Flip Slide)

If an edge of a RST can exist on two adjacent edges among four edges surrounding a Bin on U(Vu, Eu) and if no Steiner node exists on the intersection of the two edges, a flip slide is possible.

(Properties of Slides)

A given RST is instable, and therefore, any other edge of the RST is not overlapped by a parallel slide or flip slide. There are four important properties concerning slides, which are used to reduce a search space when searching for a slide range.

(Property 1)

In a RST which is created by deformation based on a combination of parallel and flip slides, the number of vertical edges in each lateral row (on U(Vu, Eu)) is constant, and the number of horizontal edges in each vertical column (on U(Vu, Eu)) is also constant.

(Property 2)

Any other edge of a RST cannot be moved by combinations of parallel and flip slides to both edges in one single Bin which allows an edge to slide, the edge is not slidable.

(Property 3)

If only one vertical edge exists in a row, all horizontal edges of a RST cannot cross the row by parallel slides. The same applies to (vertical) columns.

(Property 4)

If only one edge is connected to any vertex of a RST which is not a Steiner point, the edge cannot be slid parallel.

(RST Deformation Processing 1)

Figure 8:
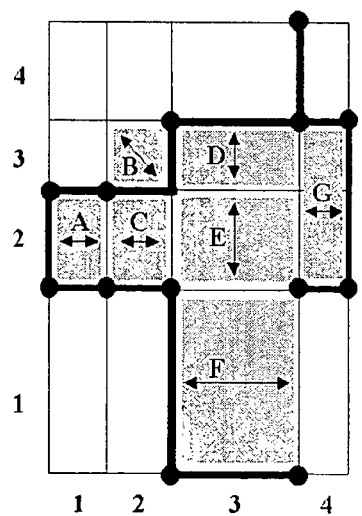
FIG. 8 explains a case where the maximum slidable range is searched for only by sequential deformation on an underlying grid graph.

With respect to each edge $Ej \in Es$ of a RST S(Vs, Es) given to a net N, at first, the greatest slidable range is searched for by only sequential deformation on U(Vu, Eu), as shown in FIG. 8. At this time, the slidability of an edge depends on whether other edges are slidable or not. That is, according to the definition 1, the parallel slide needs existence of two edges which enables a parallel slide. While creating dependency, the greatest slidable range is searched for every edge. As a result, the dependency between the slidable range of each edge and slidability of any other edge is created as a dependency graph shown in FIG. 9.

(Slides and Dependency)

If one edge is slidable on plural Bins as shown in FIG. 8 indicative of slidable ranges of edges, a slidable range is defined for every Bin. If an edge is slidable (slidability of an edge), there can be seven cases of A to G as shown in FIG. 8. The dependency graph shown in FIG. 9 shows dependency which is necessary to enable these seven cases of slidability. For example, the West edge of the Bin (1, 2) is related to slidability A and C, so that A and C are dependent on each other.

The slidablity C depends on the slidability B. This is because edges must exist in the South and East of the Bin (2, 3) in the movement of an edge in which the slidable C depends on the slidable B. The slidable E depends on the slidable D because the North edge of the Bin (3, 3) relates to the slidable D and E. Further, edges must exists in the East and West of the Bin (3, 3), in order to make E slidable. Therefore, the slidablility E depends on the slidable C and G.

From the above, a pseudo code of an algorithm for calculating the wire congestion degree by applying sequential deformation to one RST is given as shown in FIG. 10.

In FIG. 10, "Check_flip_slide" searches for flip-slidable locations and registers the locations in the dependency graph. The "Check_para_slide" checks whether or not a specified edge is parallel-slidable in a specified direction in a given RST.

When this parallel slide depends on other parallel or flip slides, the dependency is registered in the dependency graph shown in FIG. 9. Further, "Get_independent_complete-_graph" creates a complementary graph (independency graph), which will be described later with reference to FIG. 13, from the dependency graph, and extracts all the partial complete graph from the complementary graph. "Calculate-_congestion" calculates the wire congestion degree on the grid graph which will be described later in <Calculation of Wire Congestion Degree> with use of the partial complete graph obtained from the complementary graph. The pseudo code of "Check_para_slide" is shown in FIG. 11.

In FIG. 11, "Get_destination" is a function which returns a destination when a specified edge of a RST is parallel-slid in a specified direction. The destination is an edge existing in a specified direction among edges adjacent to the specified edge on the underlying grid graph. "Move_edges_to-_both_sides" is a function to slide edges of the RST to two other edges on a Bin which includes an edge to be slid and a target edge, in order to make the edge parallel-slidable to a location obtained by the "Get_destination". At this time, the edges may be parallel-slid or flip-slid.

If edges of the RST can be slid to two edges on the Bin, "SUCCESSFUL" is returned as "result". If "SUCCESSFUL", the edge inputted to the "Parallel_slide Check-_para_slide" is actually slid, and then, the "Check-_flip_slide" searches for flip-slidable locations and registers the locations in the dependency graph. Thereafter, this processing is repeated with respect to a next adjacent edge on the underlying grid graph. By the "Move_edges_to_both-_sides", the "Check_para_slide" is called recursively, and the recursion ends if edges of the RST cannot be parallel-slid any more. This determination is carried out by using the properties 3 and 4.

Figure 12:
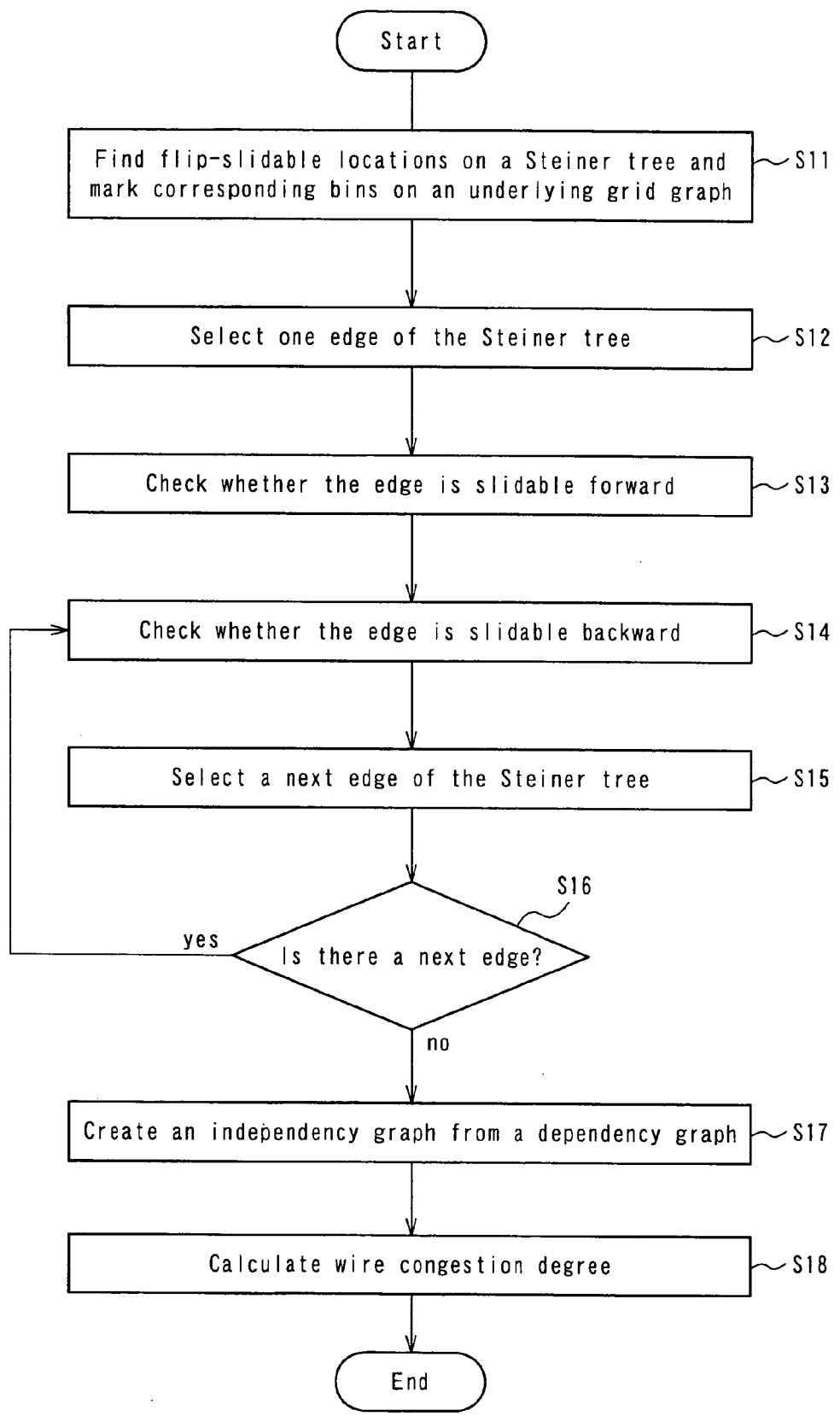
FIG. 12 is a flowchart showing operation of a RST deformation processing.

The above-described operation of deformation processing for a RST is shown in the flowchart of FIG. 12. To explain the operation of this flowchart as a summary of the deformation processing described above, at first, a flip-slidable location is searched for in a created RST, and a corresponding Bin on the underlying graph is marked (step S11). Next, an edge is selected from edges constituting the RST (step S12), and whether the selected edge is slidable or not is checked (steps S13 and S14). Slides are carried out sequentially in the forward direction (rightward or upward direction) and backward direction (leftward or downward direction). The processing in this step S13 will be described in detail later.

Upon completion of the check about slidability, a next edge of the RST is selected (steps S15 and S16), and whether the edge is slidable or not is checked similarly (steps S13 to S16). Thus, the slidability check is completed for every edge (no in step S16), and a dependency graph concerning slidability is completed. Therefore, a complementary graph (independency graph) is created (step S17). This complementary graph is a dependency graph which shows dependency of slides.

Further, as will be described in detail in <Calculation of Wire Congestion Degree>, the number of variations obtained by deformation of a RST is calculated while determining independent slidability from the independency graph. Among the variations on the RST, the number of those RSTs that pass each vertex of the grid graph is obtained, and thus, the wire congestion degree at each vertex of the grid graph can be calculated (step S18).

Next, the operation of step S13 will be described with reference to FIGS. 14 to 17.

Figure 15:
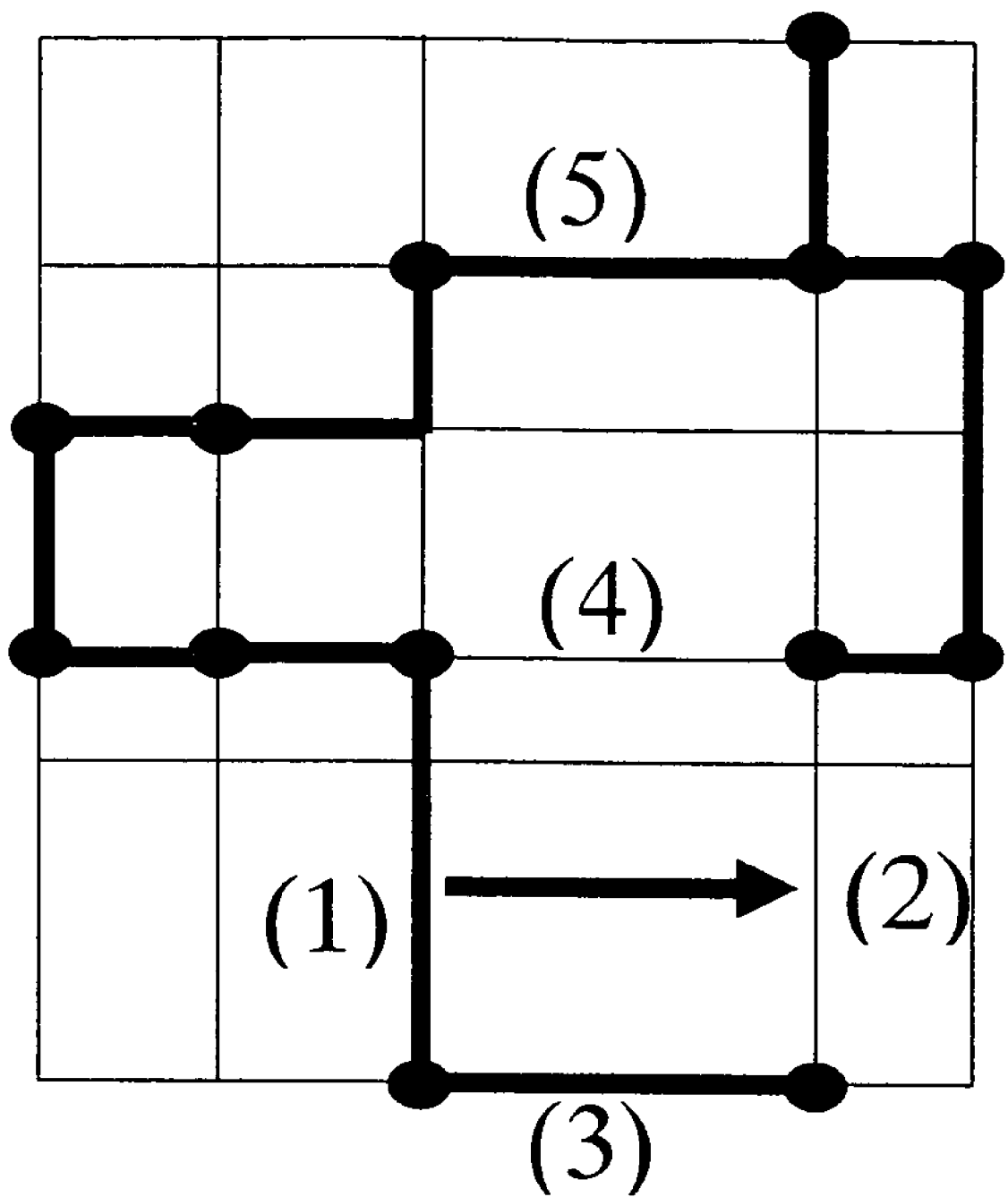
FIG. 15 is a graph complementarily explaining the operation of FIG. 14.

At first, a destination is determined in case where an edge is slid, by only one grid, in the forward direction on the underlying grid graph (step S131). This means that, for example, when the target edge to be slid is (1) as shown in FIG. 15, the destination is determined as the position (2). Next, two sides that allow the edge to be slidable to the destination are obtained (step S132). In FIG. 15, (3) and (4) denote the two sides.

Figure 16:
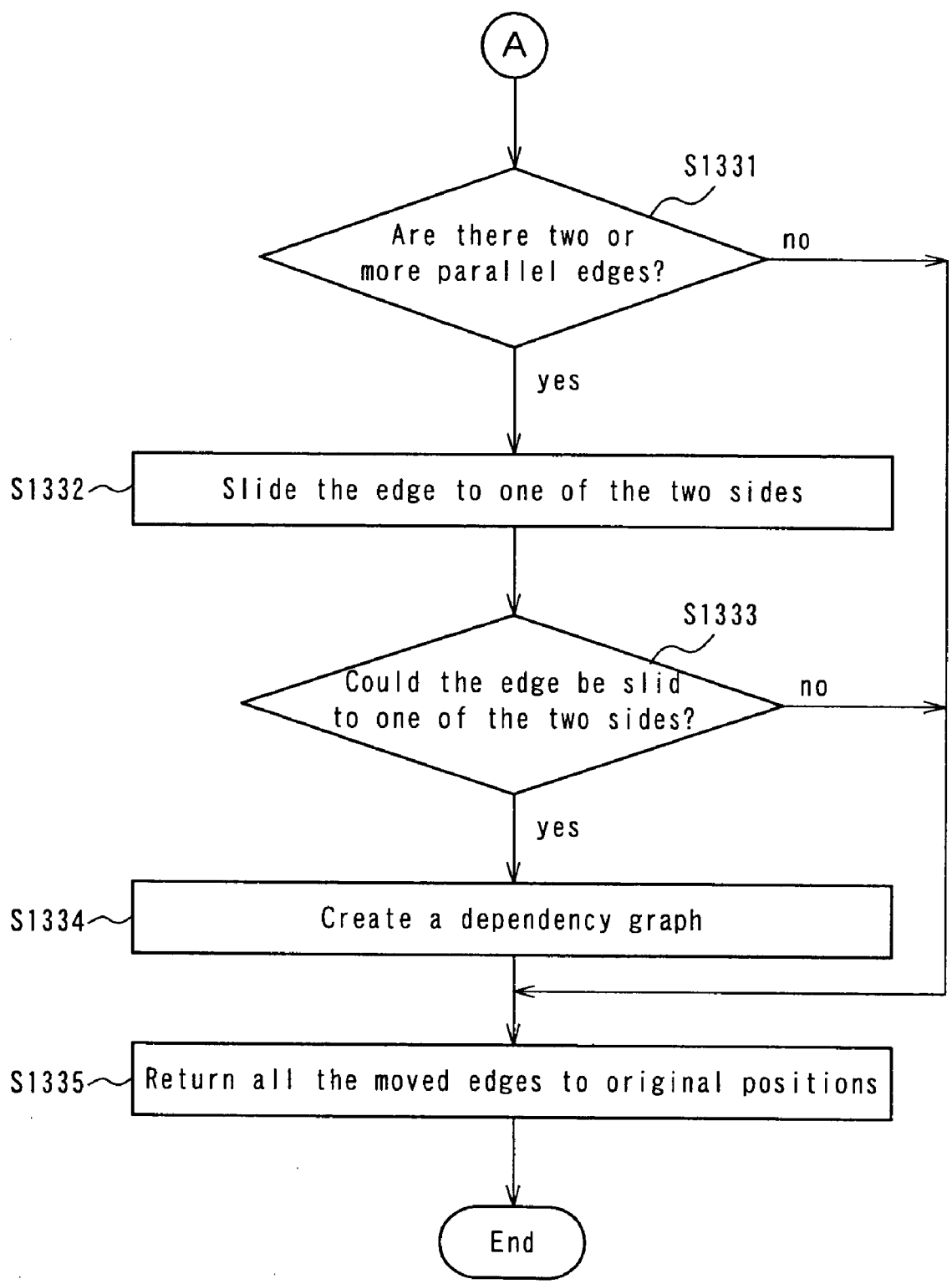
FIG. 16 is a flowchart showing (second) operation of checking slidability.

Whether an edge exists on one of the two sides (the location (3) in FIG. 15) or not is then determined (step S133). If yes, whether another edge exists on the other one of the two sides (the location (4) in FIG. 15) or not is determined (step S134). If no edge exists on either one of the two sides, the processing shown in FIG. 16 is carried out. If edges are determined to exist on both the two sides, the target edge to be slid is slid in the forward direction to the destination (step S135). Further, a flip-slidable location is searched for on the RST, and a corresponding Bin on the underlying grid graph is marked (step S136). Thereafter, moved edges are all returned to original locations, and the processing is terminated (step S137).

Next, the processing in case where no edge exists on either one of the two sides will be described with reference to FIG. 16.

Figure 17:
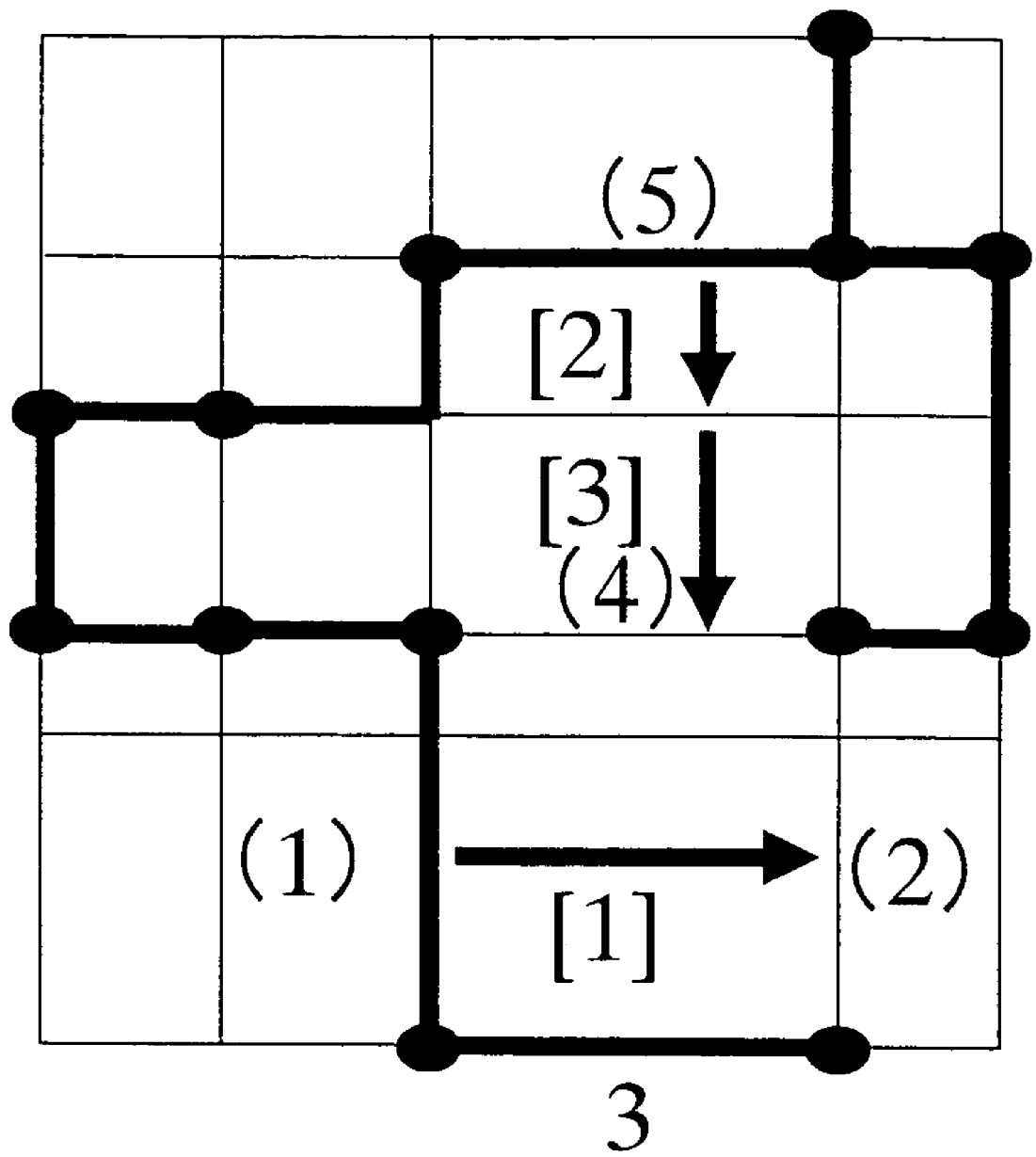
FIG. 17 is a graph complementarily explaining the operation of FIG. 16.

At first, whether two or more edges are parallel to the destination (the location (4) in FIG. 17) or not is determined in order to determine whether an edge can be moved to one of the two sides (the location (4) in FIG. 17) (step S1331). If it is determined that there are two or more parallel edges, the edge ((5) in FIG. 17) is slid to the one of the two sides (the location (4) in FIG. 17).

Figure 14:
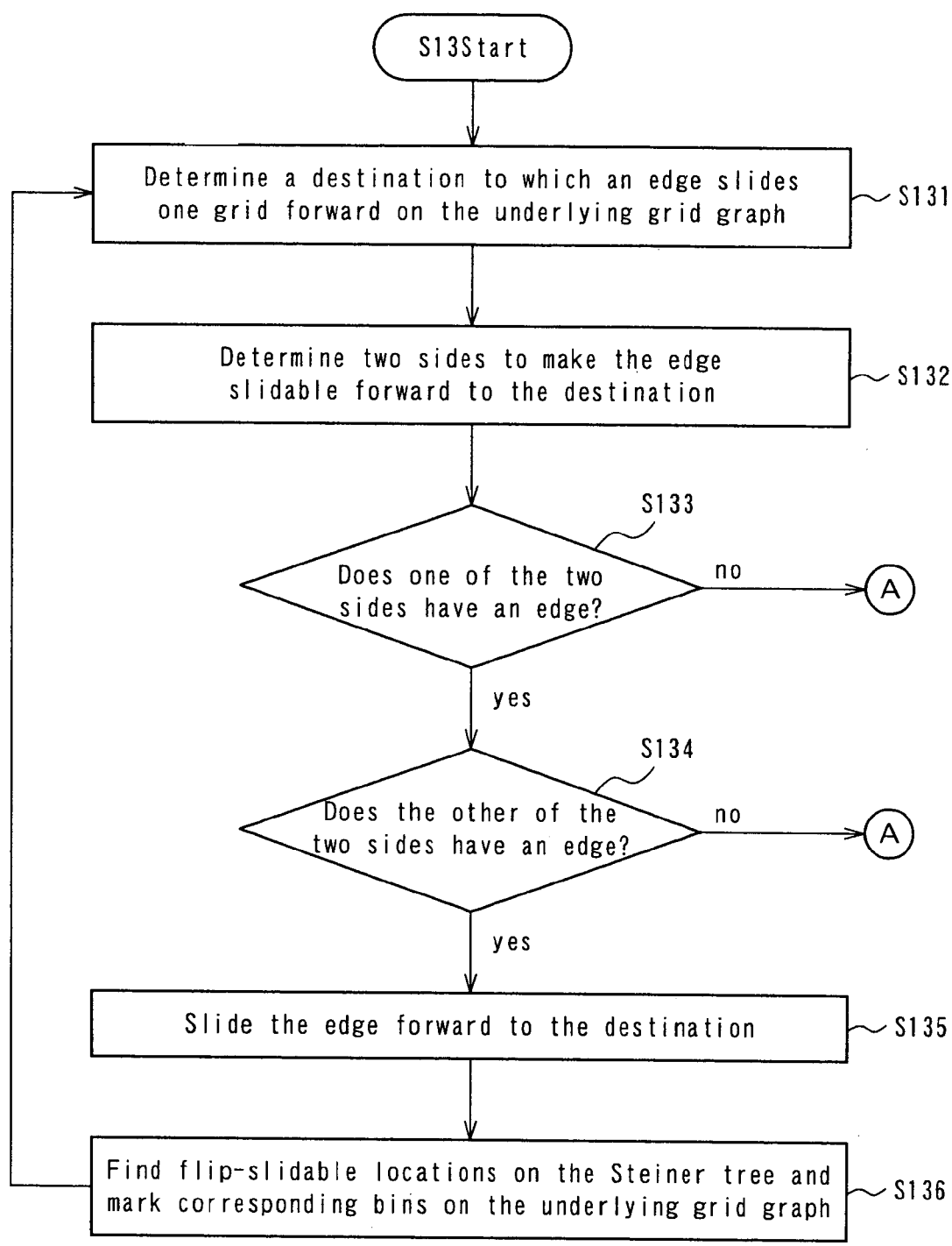
FIG. 14 is a flowchart showing (first) operation of checking slidability.

The procedure of the slide is basically the same as the processing explained with reference to FIG. 14. In the processing in FIG. 14, the edge is moved sequentially grid by grid on the underlying grid graph. However, the present case differs from FIG. 14 in that the edge cannot be limitlessly moved but can be moved only to the predetermined destination although the edge is also moved grid by grid. Further, whether the edge could be slid to the one of the two sides (the location (4) in FIG. 17) or not is determined (step S1333). If the edge could be slid, a dependency graph is created (step S1334).

In this case, the movement [1] depends on movements [2] and [3]. After creating the dependency graph, or if it is determined in step S1331 that there are not two or more parallel edges, or if it is determined in step S1333 that the edge cannot be slid to the one of the two sides, all the moved edges are returned to the original locations, and the processing is terminated (step S1335).

(RST Deformation Processing 2)

The above-described deformation processing for a RST may be added with different variations on the RST by performing deformation based on deletion and reconnection.

Figure 18:
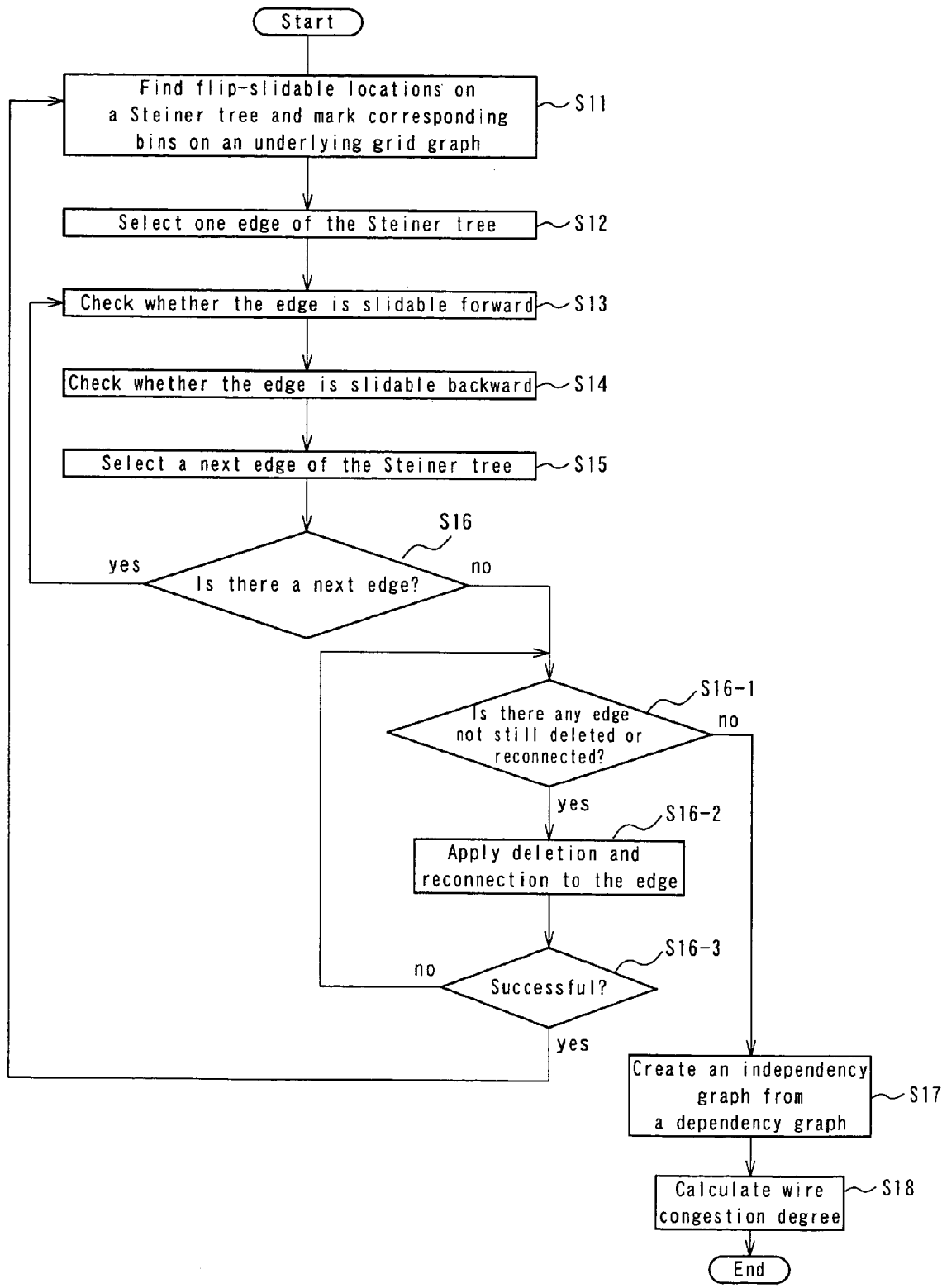
FIG. 18 is a flowchart showing operation of deleting and reconnecting an edge.

FIGS. 18 and 19 explain the deformation of a RST based on deletion and reconnection. In the processing of deletion and reconnection, steps S16-1 to S16-3 are inserted behind the step S16 shown in FIG. 12.

Step S16-1 makes a determination to perform deletion and reconnection on all possible edges. If there still remains an edge to be deleted and reconnected, the processing goes to step S16-2 and performs a deletion and reconnection processing on the edge. In this deletion and reconnection processing, a processing of deleting any one of the edges (1) to (6) and reconnecting the same length as the deleted edge is carried out, for example, as shown in FIGS. 19A to 19C.

In FIGS. 19A to 19C, the edge (1) in FIG. 19A is deleted to obtain a graph shown in FIG. 19B, and then, the edge (1)' is reconnected to achieve the deformation of the RST, as shown in FIG. 19C.

By this deformation, a new deformed variation on the RST can be obtained, and further, a sequential deformation processing of steps S11 to S16 is performed on the variation (step S16-3, y).

Upon completion of all the deformation processing (yes in step S16-1), the processing goes to step S17, and creates an independency graph as described previously (step S17), and calculates the wire congestion degree (step S18).

<Calculation of Wire Congestion Degree>

Described next will be a method of obtaining Qx, y, dir from the dependency graph of edge slidability which is outputted after the deformation algorithm. The total number of RSTs having different topologies based on deformation on a RST can be obtained by determining independency of slides. A slide of an edge of a RST on a Bin is defined as slide(kind, dir, x, y). The "kind" expresses the type of the slide, e.g., parallel or flip. The "dir" is any of East, West, South, and North.

For example, slide(parallel, East, x, y) means that an edge of a RST existing on the West edge of a Bin (x, y) is parallel-slidable. Similarly, slide(flip, dir, x, y) means that the edge is flip-slidable in the direction dir. The "dir" indicates the direction in which a vertex (apex or intersection) between two edges is moved by a flip slide, and is any of NE (North-East), NW (North-West), SE (South-East), and SW (South-West).

Each slide has dependency on other slides. An independent slide means that, when an edge which another edge to be slid passes is not slidable, this slide(parallel, East, x, y) is considered to be independent from other slides. Inversely, when the edge to pass is a slide(parallel, dir, x', y') or slide(flip, dir, x', y'), this slide is considered to be independent from these slides.

This dependency is expressed by the dependency graph D(Vd, Ed) shown as an example in FIG. 9. Each vertex (vertices A to G) in this graph expresses the slide(kind, dir, x, y). Edges express dependency of slides and are directed edges. Hence, the number of variations based on deformation of a RST can be calculated.

$Vj \in Vd$ in the graph D(Vd, Ed) means that edges of a RST corresponding to $Vj \in Vd$ are movable on the RST. The slidable distance of an edge on the RST is expressed as dj, and the number of vertices $|Vd|$ of the graph D(Vd, Ed) is expressed as r. The slidable distance dj is defined in units of grids of G(Vg, Eg) and corresponds to the number of grids including the two ends of the edge. At this time, if all slidable edges are slidable independently from each other, i.e., if the number of edges $|Ed|$ on the graph D(Vd, Ed) is 0, the number of variations P can be expressed by the following expression (3). All products in the expression (3) are performed with respect to all of j.

$$P(d1, d2, d3, \ldots dr) = \Pi dj \quad (3)$$

A group in which plural edges can move independently from each other is called an independent slidability group. If this group exists, i.e., if there is a set v of vertices which do not have mutually directed edges on the graph D(Vd, Ed), the number of variations of an RST based on slides corresponding to those vertices is a value obtained where the slidable distances corresponding to the respective elements of v in the expression (3) are fixed to 1. Thus, all of the independently movable groups are obtained, and the number of variations is set to pk for each group. Then, |T(S(Vs, Es))| is obtained by the expression (4). At this time, the product based on S is performed for each element of k.

$$|T(S(Vs, Es))| = Spk \qquad (4)$$

Thus, with respect to the number of variations on the RST, the number of variations |T(S(Vs, Es), bin(Vj∈Vd))| which pass a bin on U(Vu, Eu) where the edges of the graph D(Vd, Ed) corresponding to Vj∈Vd slide is the total sum of the numbers of variations pk of the independent slidability group including Vj.

$$|T(S(Vs, Es), bin(Vj \in Vd))| = Spk \qquad (5)$$

The independent slidability group can be obtained from a dependency graph concerning slidability of edges. At first, a complementary graph (independency graph) Dc(Vd, Ed) shown in FIG. 13 in which edges are created at locations where D(Vd, Ed) edges do not exist is created from the dependency graph D(Vd, Ed) shown in FIG. 9. This complementary graph Dc(Vd, Ed) expresses independency which means that the respective edges are slidable independently from each other.

Next, from Dc(Vd, Ed), all partial complete graphs (complementary graphs) are sought. For each of the partial complete graphs, the number of variations on the RST which can be generated from each independent slidability group is obtained according to the expression (4). Thereafter, the number of variations on the RST obtained by applying sequential deformation once to the given RST can be obtained according to the expression (5). A specific example of the expression (3) can be expressed by the following expression (6), with respect to the RSTs obtained by once applying sequential deformation to the RST shown in FIG. 8.

Note that the expression |$A_N$| in the expression (6) expresses a slidable distance at A, and also expresses the length of an edge of N(North) of a Bin of A. A and C shares one edge existing in West of the Bin (1, 2). Therefore, dj in the expression (3) is defined with respect to the collection of A and C. At this time, dj is |$A_N$|+|$C_N$|. In case of a flip slide denoted at B (FIG. 8), there can be vertical and horizontal slides, so that dj is |$B_S$|+|$B_E$| with respect to B.

$$(|A_N|+|C_N|) \times (|B_S|+|B_E|) \times (|D_W|+|E_W|) \times |F_N|+|G_N| \qquad (6)$$

Figure 13:
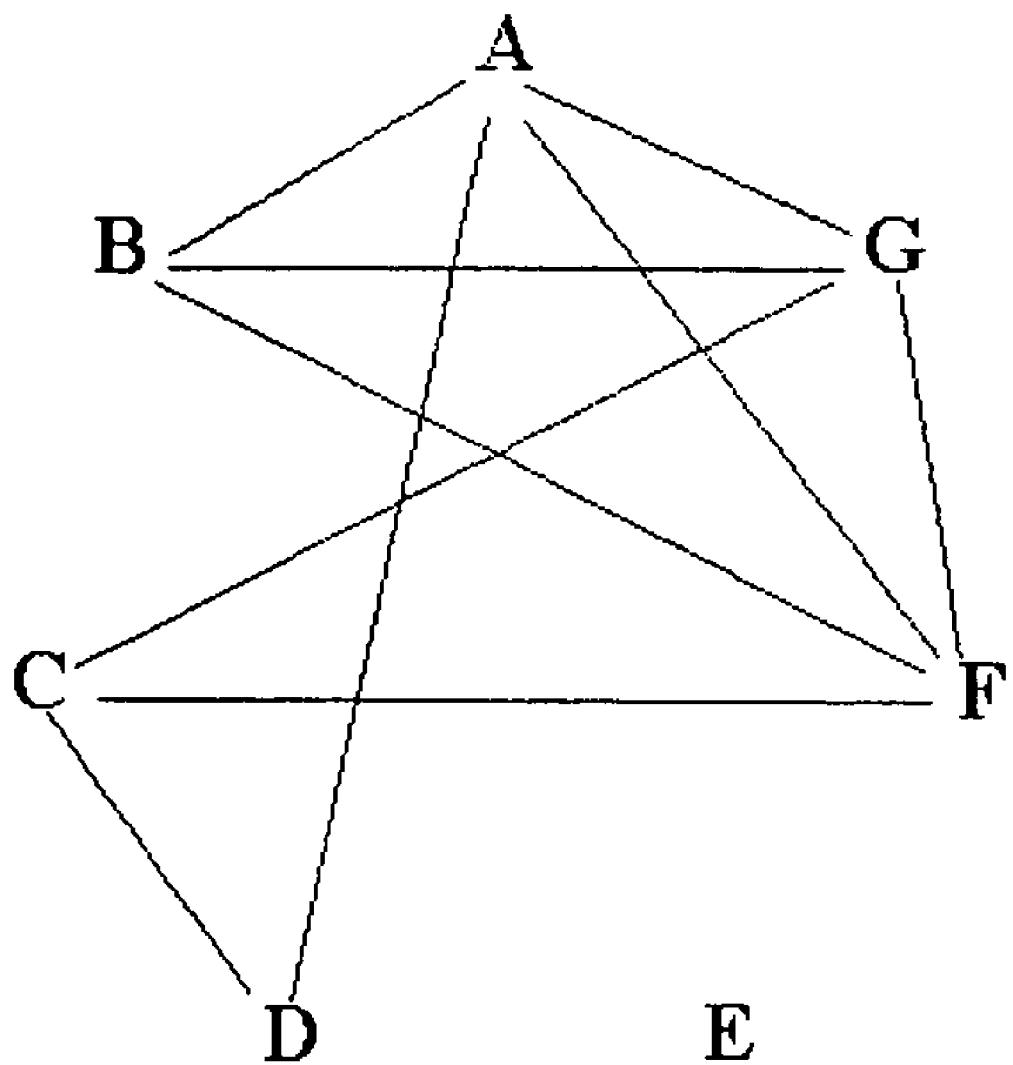
FIG. 13 shows a complementary graph (independency graph)

In case of this example, five independent slidability groups of {A, B, F, G}, {C, F, G}, {C, D}, {A, D}, and {E} exist from FIG. 13. The number of variations on the RST is obtained for each of these five groups, based on the expression (6). The following expressions (7) to (11) are obtained from the definition of each term in the expression (4).

$$(|A_N|+0) \times (|B_S|+|B_E|) \times |x| \times |F_N| \times |G_N| \qquad (7)$$

$$(0+|C_N|) \times |x| \times |x| \times |F_N| \times |G_N| \qquad (8)$$

$$(0+|C_N|) \times |x| \times (|D_W|+0 \times |x|) \qquad (9)$$

$$(|A_N|+0) \times |x| \times (|D_W|+0) \times |x| \qquad (10)$$

$$|x| \times |x| \times (0+|E_W|) \times |x| \qquad (11)$$

Accordingly, the number of variations on the RST |T(S (Vs, Es))| obtained by once applying sequential deformation to a given RST is the sum of the expressions (7) to (11). The number of those variations on the RST in which A passes a certain Bin is the total of those expressions of (7) to (11) that include A. In the example shown in FIG. 8, the numbers of variations on the RST are respectively 1024, 128, 16, 16, and 6 for independent slidability groups {A, B, F, G}, {C, F, G}, {C, D}, {A, D}, and {E} where An, Be, Bs, Cn, Dw, Gn=4, Ew=6, Fn=8. Therefore, the total of the numbers of variations on the RST by one application of sequential deformation is 1190. Hence, the slidable range of each edge of a given RST and the number of variations on the RST in each slidable range can be found out.

However, when an edge has a Bin as a slidable range, the number of variations on the RST differs between the boundaries and the inside of the Bin. For example, in case of the Bin of the slidable range G, the number of variations on the RST is the total of the numbers of variations of {A, B, F, G} and {C, F, G}, including the left and right boundaries and the inside of the Bin. At this time, if an edge is fixed to the left boundary of the Bin G, the sum of variations on groups {C, D}, {A, D}, and {E} which do not include G among independent slidability groups is added.

Thus, whenever a set of Bins exists as movable ranges of an edge, the edge always exists at any part of the set of Bins. Therefore, the number of variations on a RST in which an edge exists in a movable range is equal to |T(S(Vs, Es))|. The wire request quantity at the Bin G is calculated by the expression (12) with respect to vertical wires on the upper and lower boundaries of one grid on the area other than the left boundary. The wire request quantity is also calculated by the expression (13) with respect to vertical wires on the upper and lower boundaries of one grid on the left boundary.

$$(1024+128)/1190/4 \approx 0.242 \qquad (12)$$

$$(1024+128)/1190/4+(16+16+6)/1190/1 \approx 0.2739 \qquad (13)$$

Figure 20:
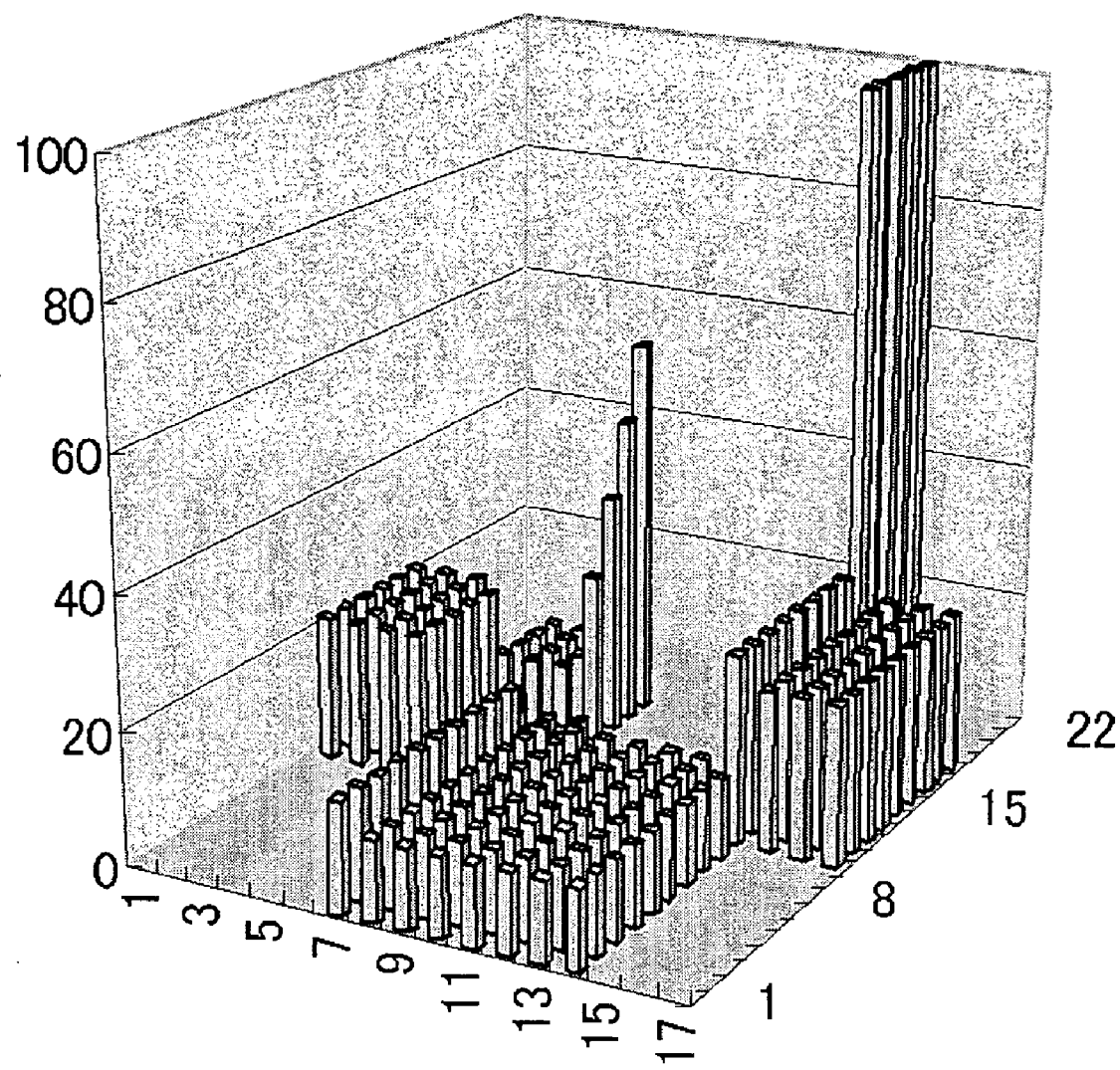
FIG. 20 is a graph showing a state where wire request quantities based on variations on the RST are calculated and indicated at respective locations (x, y)

The calculations for the wire request quantities, as described above, are performed on the RST shown in FIG. 8, based on variations on the RST where An, Be, Bs, Cn, Dw, Gn=4, Ew=6, Fn=8. The wire request quantities thus calculated are shown, with respect to each location (x, y), in FIG. 20.

Figure 21A:
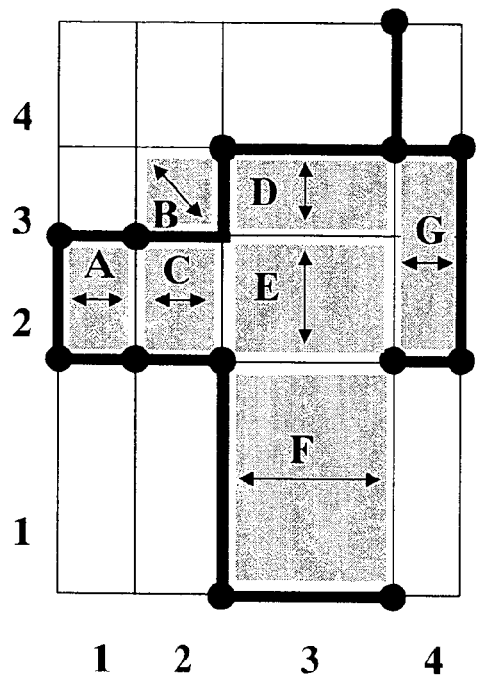
FIGS. 21A and 21B are graphs explaining an example of operation in a case where the calculation of wire request quantities are performed on plural nets.

If the wire request quantity calculations are performed on plural nets, the wire request quantities are calculated with respect to Bins of slidable areas A to G as shown in FIG. 21A and the boundaries thereof, at first with respect to one net. Thereafter, the wire request quantity calculated from each net is added up to four edges (East, West, South, and North) of each vertex on the grid graph. However, if the added-up wire request quantities exceed a preset wiring tolerance capacitance, the wire request quantities can be calculated again, taking as a non-slidable area the slidable area shown in FIG. 21A which includes even a part of the exceeded area.

Figure 21B:
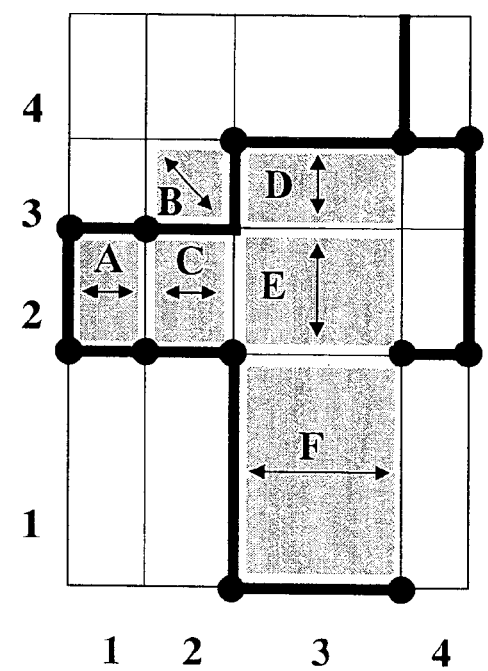

For example, if the added-up wire request quantities with respect to the area of the slidable area G in FIG. 21A exceed the wiring tolerable capacitance thereof, the wire request quantities are calculated again with respect to other areas, taking the slidable area G as a non-slidable area as shown in FIG. 21B. If all slidable areas are taken as non-slidable areas, calculation processings are carried out with all the slidable areas kept slidable.

As has been specifically described above, the embodiments of the present invention have been proposed a method of deformation of a RST and a method of wire property estimation according to a probabilistic method based thereon. Geometric deformation of a RST is not limited only to wire property estimation based on the probabilistic method but also allows creation of a RST which avoids areas having high wire congestion degree. Further, when there is a great difference in capacitance between vertical and horizontal wire channels, the deformation of a RST enables such deformation that makes respectively the total length of vertical edges and the total length of horizontal edges closer to lengths fit for purposes. It has been proved that the wire property estimation based on the present method has significant correlation with actual wiring results. These experimental results support the inventor's ideas. The wire property estimation proposed herein will steadily be applied to practical stages of cell layout.

What is claimed is:

1. A Steiner tree handling device which handles a Steiner tree constituted by plural horizontal or vertical edges connecting plural nodes, comprising:
    a Steiner tree obtaining unit which obtains a Steiner tree having at least one shape;
    a Steiner tree deformation unit which deforms the obtained Steiner tree into a Steiner tree having a different shape without changing the size of the obtained Steiner tree;
    a dependency graph creation unit which creates a dependency graph by determining dependency as to whether slides of each edge depend on slides of other edges or not, when the Steiner tree deformation unit performs the deformation;
    an independent slide group determination unit which determines a group of independently slidable edges, based on the graph created by the dependency graph creation unit; and
    a partial variation calculation unit which, if an edge of the Steiner tree moves in a predetermined range, calculates a number of deformed variations on the Steiner tree that includes the edge moving, based on a determination result from the independent slide group determination unit.

2. The Steiner tree handling device according to claim 1, wherein the Steiner tree deformation unit deforms the Steiner tree, while maintaining continuity of the Steiner tree.

3. The Steiner tree handling device according to claim 2, further comprising a slidability determination unit which determines whether one edge is slidable or not based on a predetermined determination reference, wherein
    the Steiner tree deformation unit slides the one edge to deform the Steiner tree.

4. The Steiner tree handling device according to claim 3, wherein if an edge of the Steiner tree exists on opposed edges of a Bin formed by the Steiner tree and if an end of another edge or a node exists on each of two ends of each of the opposed edges, the slidability determination unit determines that the edge of the Steiner tree on the opposed edges is parallel-slidable.

5. The Steiner tree handling device according to claim 3, wherein if an edge of the Steiner tree exists on two adjacent edges of four edges of a rectangle surrounding a Bin formed by the Steiner tree and if no node of the Steiner tree exists on an intersection of the two adjacent edges, the slidability determination unit determines that the edge on the two adjacent edges is flip-slidable.

6. The Steiner tree handling device according to claim 3, wherein the slidability determination unit uses, as a deformation property of the Steiner tree, a rule that in deformation based on a parallel or flip slide or a combination thereof, the number of vertical edges of the Steiner tree in a horizontal row defined by each of plural Bins formed by the Steiner tree is constant and the number of horizontal edges of the Steiner tree in a vertical column defined by each of plural Bins formed by the Steiner tree is constant.

7. The Steiner tree handling device according to claim 3, wherein the slidability determination unit uses, as a deformation property of the Steiner tree, a rule that an edge is not slidable if any other edge of the Steiner tree cannot be located on both edges of one single Bin which makes the edge slidable, by deformation based on a parallel or flip slide or a combination thereof.

8. The Steiner tree handling device according to claim 3, wherein the slidability determination unit uses, as a deformation property of the Steiner tree, a rule that the number of vertical edges existing in a horizontal row defined by a Bin is one, all horizontal edges of the Steiner tree cannot intersect the horizontal row by a parallel slide, and if the number of horizontal edges existing in a vertical column defined by a Bin is one, all vertical edges of the Steiner tree cannot intersect the vertical column by a parallel slide.

9. The Steiner tree handling device according to claim 3, wherein the slidability determination unit uses, as a deformation property of the Steiner tree, a rule that if only one edge is connected to a location which is not a node of the Steiner tree, the edge cannot be parallel-slid.

10. The Steiner tree handling device according to claim 1, wherein the Steiner tree deformation unit deforms the Steiner tree by deleting an edge of the Steiner tree to create two edge sequences and reconnecting the sequences with use of an edge different from the deleted edge.

11. The Steiner tree handling device according to claim 1, further comprising a total variation number calculation unit which obtains the total number of deformed variations on the Steiner tree, based on a determination result from the independent slide group determination unit.

12. The Steiner tree handling device according to claim 11, further comprising a congestion degree calculation unit which calculates congestion degree of edges in a predetermined area, based on the total number of variations on the Steiner tree calculated by the total variation number calculation unit, and the number of variations of the Steiner tree calculated by the partial variation calculation unit.

13. The Steiner tree handling device according to claim 11, wherein if the number of those edges that pass any of plural predetermined areas exceeds a predetermined number as the Steiner tree is deformed, edges are regarded as not being slidable in said any of the predetermined areas, and the Steiner tree is deformed again, to calculate the total number of variations by the total variation number calculation unit and the number of variations by the partial variation calculation unit.

14. The Steiner tree handling device according to claim 13, wherein the deformation made again and the calculations are performed on plural Steiner trees which are obtained by the Steiner tree obtaining unit respectively in correspondence with plural different sets of nodes.

15. The Steiner tree handling device according to claim 1, wherein the partial variation calculation unit calculates a wire quantity for every predetermined area, in each of the vertical and horizontal directions, regarding every edge in one shape of the Steiner tree as a wire.

16. A Steiner tree handling method for handling a Steiner tree constituted by plural horizontal or vertical edges connecting plural nodes, comprising:

obtaining a Steiner tree;

deforming the obtained Steiner tree into a Steiner tree having a different shape without changing the size of the obtained Steiner tree;

creating a dependency graph by determining dependency as to whether slides of each edge depend on slides of other edges or not, when performing said deforming;

determining an independent slide group of independently slidable edges, based on the dependency graph; and calculating a partial variation, if an edge of the Steiner tree moves in a predetermined range, by calculating a number of those deformed variations on the Steiner tree that includes the edge moving, based on a determination result from said determining of the independent slide group.

17. The Steiner tree handling method according to claim 16, further comprising calculating a total variation number of obtaining the total number of deformed variations on the Steiner tree, based on a determination result from said determining of the independent slide group.

18. The Steiner tree handling method according to claim 17, further comprising calculating a congestion degree of edges in a predetermined area, based on the total number of variations on the Steiner tree calculated, and the number of variations on the Steiner tree calculated.

19. The Steiner tree handling method according to claim 17, wherein if the number of those edges that pass any of plural predetermined areas exceeds a predetermined number as the Steiner tree is deformed, edges are regarded as not being slidable in said any of the predetermined areas, and said deforming of the Steiner tree, said calculating of the total variation number, and said calculating of the partial variation calculation are repeated again.

20. A computer-readable medium having recorded thereon a Steiner tree handling program for causing a computer to execute a processing of handling a Steiner tree constituted by plural horizontal or vertical edges connecting plural nodes, the processing comprising:

obtaining a Steiner tree;

deforming the obtained Steiner tree into a Steiner tree having a different shape without changing the size of the obtained Steiner tree;

creating a dependency graph by determining dependency as to whether slides of each edge depend on slides of other edges or not, when performing said deforming;

determining an independent slide group of independently slidable edges, based on the dependency graph; and calculating a partial variation, if an edge of the Steiner tree moves in a predetermined range, by calculating a number of those deformed variations on the Steiner tree that includes the edge moving, based on a determination result from said determining of the independent slide group.

21. The Steiner tree handling program according to claim 20, comprising calculating a total variation number of obtaining the total number of deformed variations on the Steiner tree, based on a determination result from said determining of the independent slide group.

22. The Steiner tree handling program according to claim 21, wherein the processing further comprises calculating a congestion degree of edges in a predetermined area, based on the total number of variations on the Steiner tree calculated, and the number of variations on the Steiner tree calculated.

23. The Steiner tree handling program according to claim 21, wherein if the number of those edges that pass any of plural predetermined areas exceeds a predetermined number as the Steiner tree is deformed, edges are regarded as not being slidable in said any of the predetermined areas, and said deforming of the Steiner tree, said calculating of the total variation number, and said calculating of the partial variation are repeated again.

* * * * *

UNITED STATES PATENT AND TRADEMARK OFFICE
CERTIFICATE OF CORRECTION

PATENT NO. : 7,266,799 B2 Page 1 of 1
APPLICATION NO. : 10/893935
DATED : September 4, 2007
INVENTOR(S) : Noriyuki Ito It is certified that error appears in the above-identified patent and that said Letters Patent is hereby corrected as shown below:

Title Page, Column 1 (Foreign Patent Documents), Line 1, change "2003-357744" to --2000-357744--.

Title Page, Column 2 (Other Publications), Line 14, change "w.H." to --W.H.--.

Signed and Sealed this

Twenty-fifth Day of December, 2007

JON W. DUDAS
*Director of the United States Patent and Trademark Office*